(12) United States Patent
Kuwata et al.

(10) Patent No.: US 11,025,205 B2
(45) Date of Patent: Jun. 1, 2021

(54) HIGH FREQUENCY AMPLIFIER

(71) Applicant: Mitsubishi Electric Corporation, Tokyo (JP)

(72) Inventors: Eigo Kuwata, Tokyo (JP); Yutaro Yamaguchi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/478,427

(22) PCT Filed: Feb. 22, 2017

(86) PCT No.: PCT/JP2017/006545
§ 371 (c)(1),
(2) Date: Jul. 16, 2019

(87) PCT Pub. No.: WO2018/154647
PCT Pub. Date: Aug. 30, 2018

(65) Prior Publication Data
US 2019/0372532 A1    Dec. 5, 2019

(51) Int. Cl.
*H03F 1/52* (2006.01)
*H03F 3/193* (2006.01)
(Continued)

(52) U.S. Cl.
CPC .......... *H03F 1/52* (2013.01); *H01L 29/2003* (2013.01); *H01L 29/7781* (2013.01); *H03F 3/193* (2013.01); *H03F 3/245* (2013.01)

(58) Field of Classification Search
USPC ............ 330/285, 296, 277, 311, 298, 207 P
See application file for complete search history.

(56) References Cited

U.S. PATENT DOCUMENTS 6,307,433 B1    10/2001  Ikeda
7,271,663 B2 *   9/2007  Baum .................. H03F 3/3028
                                              330/311
(Continued)

FOREIGN PATENT DOCUMENTS

JP    9-266415 A    10/1997
JP    2001-217657 A  8/2001
(Continued)

OTHER PUBLICATIONS

Office Action issued in corresponding United Kingdom Patent Application No. 1908963.0 dated Oct. 29, 2019.
(Continued)

*Primary Examiner* — Hieu P Nguyen
(74) *Attorney, Agent, or Firm* — Birch, Stewart, Kolasch & Birch, LLP

(57) ABSTRACT

When a potential difference $V_1$ between a source terminal of an E-type FET (11) and a source terminal of a D-type FET (12) is larger than a threshold voltage $V_{th}$, a protection circuit (13) starts an operation to reduce the potential difference $V_1$ such that the potential difference $V_1$ is smaller than the threshold voltage $V_{th}$. This makes it possible to prevent destruction of the E-type FET (11) even when a signal to be amplified is an RF signal.

16 Claims, 16 Drawing Sheets

(51) Int. Cl.
    *H03F 3/24*     (2006.01)
    *H01L 29/20*     (2006.01)
    *H01L 29/778*     (2006.01)

(56) References Cited

U.S. PATENT DOCUMENTS

| | | | |
|---|---|---|---|
| 9,608,437 B2 * | 3/2017 | Youssef | ............. H02H 9/046 |
| 2006/0081897 A1 | 4/2006 | Yoshida | |
| 2010/0259329 A1 | 10/2010 | Tserng et al. | |
| 2013/0187627 A1 | 7/2013 | Imada et al. | |
| 2015/0084685 A1 | 3/2015 | Hirose et al. | |

FOREIGN PATENT DOCUMENTS

| | | |
|---|---|---|
| JP | 2006-100645 A | 4/2006 |
| JP | 2008-235347 A | 10/2008 |
| JP | 2012-524412 A | 10/2012 |
| JP | 2013-153027 A | 8/2013 |
| JP | 2015-61265 A | 3/2015 |

OTHER PUBLICATIONS

International Search Report, issued in PCT/JP2017/006545, PCT/ISA/210, dated May 16, 2017.

* cited by examiner

HIGH FREQUENCY AMPLIFIER

TECHNICAL FIELD

The present invention relates to a high frequency amplifier including a first transistor and a second transistor.

BACKGROUND ART

A cascode transistor in which a first transistor and a second transistor are cascode-connected to each other is disclosed in Patent Literature 1 below.

A drain terminal of the first transistor in the cascode transistor is connected to a source terminal of the second transistor.

In the first and second transistors, when a signal is supplied from a gate terminal of the first transistor, the signal is amplified, and the amplified signal is output to the outside from a drain terminal of the second transistor.

In the cascode transistor, a protection circuit in which a switch and a capacitor are connected in series is connected in parallel between the drain terminal and a source terminal of the first transistor.

By opening the switch included in the protection circuit before the first transistor is turned on, the capacitor is not connected in parallel between the drain terminal and the source terminal of the first transistor.

In addition, by closing the switch included in the protection circuit before the first transistor is turned off, the capacitor is connected in parallel between the drain terminal and the source terminal of the first transistor.

As a result, a rise in potential difference between the source terminal of the first transistor and the source terminal of the second transistor can be suppressed, and therefore destruction of the first transistor can be prevented.

CITATION LIST

Patent Literatures

Patent Literature 1: JP 2015-61265 A

SUMMARY OF INVENTION

Technical Problem

Since a conventional protection circuit is configured as described above, in a case where a switch can be switched between an opened state and a closed state in a cycle faster than a cycle corresponding to a frequency of a signal (hereinafter referred to as a signal cycle), destruction of a first transistor can be prevented. However, when a signal supplied from the gate terminal of the first transistor is a high frequency signal, the cycle for switching the switch between an opened state and a closed state does not catch up with the signal cycle, and the first transistor may be destroyed disadvantageously.

The present invention has been achieved in order to solve the above problem, and an object of the present invention is to obtain a high frequency amplifier capable of preventing destruction of the first transistor even when a signal to be amplified is a high frequency signal.

Solution to Problem

A high frequency amplifier according to the present invention includes: a first transistor having a gate terminal or a base terminal, a high frequency signal to be amplified being supplied to the gate terminal or the base terminal of the first transistor, and the first transistor having a source terminal or an emitter terminal, either of which is grounded; a second transistor having a source terminal or an emitter terminal, either of which is connected to a drain terminal or the collector terminal of the first transistor, and the second transistor having a drain terminal and a collector terminal, an amplified high frequency signal is output from the drain terminal or the collector terminal of the second transistor; and a protection circuit to start an operation to reduce a potential difference between the source terminal or the emitter terminal of the first transistor and the source terminal or the emitter terminal of the second transistor to make the potential difference smaller than a threshold voltage when the potential difference is larger than the threshold voltage.

Advantageous Effects of Invention

According to the present invention, when the potential difference between the source terminal or the emitter terminal of the first transistor and the source terminal or the emitter terminal of the second transistor is larger than the threshold voltage, the protection circuit starts an operation to reduce the potential difference to make the potential difference smaller than the threshold voltage. Therefore, even when a signal to be amplified is a high frequency signal, destruction of the first transistor can be prevented.

DESCRIPTION OF EMBODIMENTS

Hereinafter, in order to describe the present invention in more detail, embodiments for performing the present invention will be described with reference to the attached drawings.

First Embodiment

Figure 1:
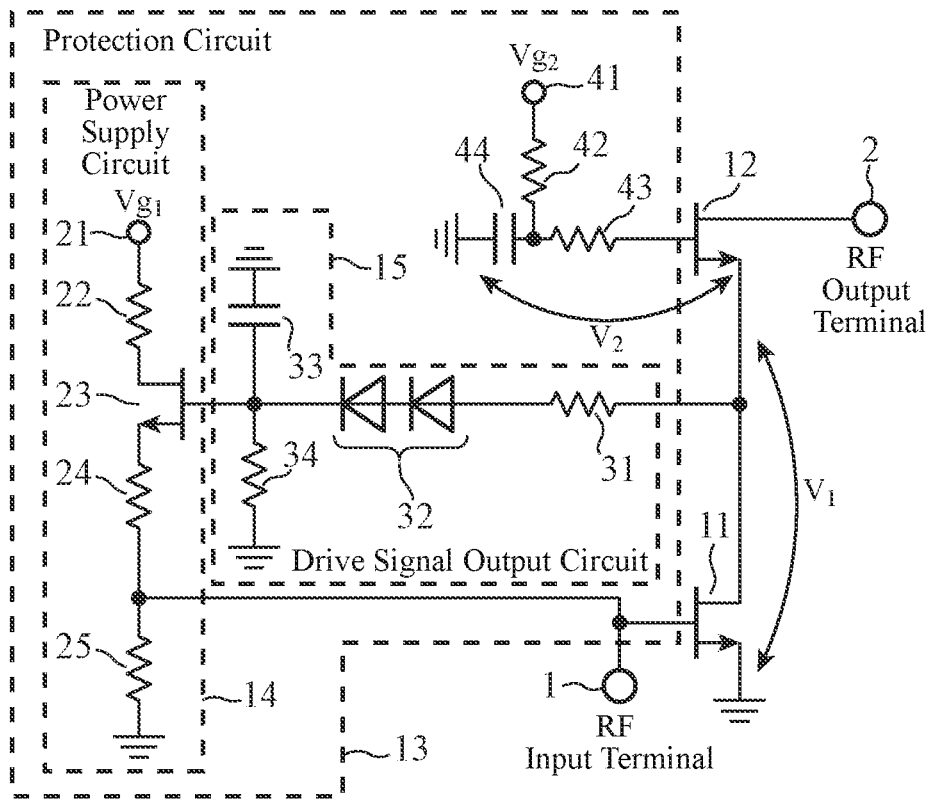
FIG. 1 is a configuration diagram illustrating a high frequency amplifier according to a first embodiment of the present invention.

FIG. 1 is a configuration diagram illustrating a high frequency amplifier according to a first embodiment of the present invention.

In FIG. 1, an RF input terminal 1 is a terminal for inputting an RF signal which is a high frequency signal to be amplified.

In the first embodiment, it is assumed that an RF signal is input from the RF input terminal 1, but a communication signal or the like in which a local oscillation signal or the like is multiplied by an RF signal may be input.

Specifically, a signal in which a signal of a continuous sine wave, a signal in which a low frequency is superimposed on a continuous sine wave, a signal in which a low frequency is superimposed on a continuous sine wave and a voltage amplitude is biased in a time axis direction, or the like is multiplied by an RF signal may be input.

An RF output terminal 2 is a terminal for outputting an RF signal amplified by an E-type FET 11 and a D-type FET 12.

The E-type FET 11 which is an enhancement type field effect transistor is a first transistor which operates at an RF frequency (high frequency).

The E-type FET 11 has a gate terminal connected to the RF input terminal 1, has a source terminal connected to the ground, amplifies an RF signal input from the RF input terminal 1, and outputs the amplified RF signal from a drain terminal thereof.

The first embodiment illustrates an example in which the first transistor is the E-type FET 11, but the present invention is not limited to this case, and for example, the first transistor may be a bipolar transistor (BJT).

When the first transistor is a BJT, a base terminal of the BJT is connected to the RF input terminal 1, and an emitter terminal of the BJT is connected to the ground.

The D-type FET 12 which is a depletion type field effect transistor is a second transistor which operates at an RF frequency.

The D-type FET 12 has a source terminal connected to the drain terminal of the E-type FET 11, a drain terminal thereof is connected to the RF output terminal 2, and an amplified high frequency signal is output from the drain terminal to the RF output terminal 2.

The first embodiment illustrates an example in which the second transistor is the D-type FET 12, but the present invention is not limited to this case, and for example, the second transistor may be a BJT.

When the second transistor is a BJT, an emitter terminal of the BJT is connected to the drain terminal of the E-type FET 11, and a collector terminal of the BJT is connected to the RF output terminal 2.

A protection circuit 13 includes a power supply circuit 14, a drive signal output circuit 15, and the like.

When a potential difference $V_1$ between the source terminal of the E-type FET 11 and the source terminal of the D-type FET 12 is larger than a threshold voltage $V_{th}$, the protection circuit 13 starts an operation to reduce the potential difference $V_1$ such that the potential difference $V_1$ is smaller than the threshold voltage $V_{th}$.

The power supply circuit 14 includes a power supply terminal 21, a resistor 22, an FET 23, a resistor 24, and a resistor 25.

The power supply circuit 14 is a circuit for applying a voltage to the gate terminal of the E-type FET 11, and operates to increase a voltage to be applied to the gate terminal of the E-type FET 11 when the potential difference $V_1$ between the source terminal of the E-type FET 11 and the source terminal of the D-type FET 12 is larger than the threshold voltage $V_{th}$.

The drive signal output circuit 15 includes a resistor 31, a diode 32, a capacitor 33, and a resistor 34.

The drive signal output circuit 15 has one end connected to the drain terminal of the E-type FET 11, and outputs a drive signal from the other end when the potential difference $V_1$ is larger than the threshold voltage $V_{th}$.

The threshold voltage $V_{th}$ in the drive signal output circuit 15 is determined by the resistors 31 and 34 and the diode 32 included in the drive signal output circuit 15.

In the first embodiment, since the other end of the drive signal output circuit 15 is connected to a gate terminal of the FET 23, a voltage is output as a drive signal from the other end of the drive signal output circuit 15. However, when a BJT is used instead of the FET 23, a current is output as a drive signal from the other end of the drive signal output circuit 15.

The power supply terminal 21 is a terminal to which a fixed voltage $Vg_1$ is applied.

The resistor 22 is a first resistor having one end connected to the power supply terminal 21.

The FET 23 is a third transistor having a drain terminal connected to the other end of the resistor 22 and the gate terminal thereof is connected to the other end of the drive signal output circuit 15.

The first embodiment illustrates an example in which the third transistor is the FET 23, but the present invention is not limited to this case, and for example, the third transistor may be a BJT.

When the third transistor is a BJT, a collector terminal of the BJT is connected to the other end of the resistor 22, and a base terminal of the BJT is connected to the other end of the drive signal output circuit 15.

The resistor 24 is a second resistor having one end connected to a source terminal of the FET 23.

The resistor 25 is a third resistor having one end connected to the other end of the resistor 24 and the gate terminal of the E-type FET 11 and having the other end connected to the ground.

The resistor 31 has one end connected to the drain terminal of the E-type FET 11.

The diode 32 has an anode terminal connected to the other end of the resistor 31 and has a cathode terminal connected to the gate terminal of the FET 23.

When a voltage obtained by subtracting a voltage drop amount in each of the resistors 31 and 34 from a drain voltage at the drain terminal of the E-type FET 11 is larger than a forward drop voltage $V_{th,D}$ of the diode 32, the diode 32 outputs a drive signal from the cathode terminal to the gate terminal of the FET 23.

The drain voltage at the drain terminal of the E-type FET 11 corresponds to the potential difference $V_1$ because the source terminal of the E-type FET 11 is connected to the ground.

The forward drop voltage $V_{th,D}$ of the diode 32 corresponds to a voltage lower than the threshold voltage $V_{th}$ by the voltage drop amount $V_R$ when it is assumed that the voltage drop amount in each of the resistors 31 and 34 is $V_R$.

The capacitor 33 has one end connected to the gate terminal of the FET 23, and has the other end connected to the ground.

The resistor 34 has one end connected to the gate terminal of the FET 23, and has the other end connected to the ground.

A power supply terminal 41 is a terminal to which a fixed voltage $Vg_2$ is applied.

A resistor 42 has one end connected to the power supply terminal 41.

A resistor 43 has one end connected to the other end of the resistor 42, and has the other end connected to the gate terminal of the D-type FET 12.

A capacitor 44 has one end connected to the other end of the resistor 42, and has the other end connected to the ground.

Next, operation will be described.

The gate terminal of the E-type FET 11 is connected to the RF input terminal 1, the drain terminal of the E-type FET 11 is connected to the source terminal of the D-type FET 12, and the drain terminal of the D-type FET 12 is connected to the RF output terminal 2.

Therefore, when an RF signal to be amplified, input from the RF input terminal 1, is supplied to the gate terminal of the E-type FET 11, an RF signal amplified by the E-type FET 11 and the D-type FET 12 is output from the drain terminal of the D-type FET 12 to the RF output terminal 2.

At this time, to the gate terminal of the D-type FET 12, a potential difference obtained by summing up a potential difference between both ends of the resistor 43 and a potential difference between both ends of the capacitor 44 is applied. In FIG. 1, a potential difference obtained by summing up a potential difference between both ends of the resistor 43, a potential difference between both ends of the capacitor 44, and a potential difference between the gate terminal and the source terminal of the D-type FET 12 is represented by $V_2$.

Under a condition in which the potential difference $V_1$ between the source terminal of the E-type FET 11 and the source terminal of the D-type FET 12 is equal to or smaller than the threshold voltage $V_{th}$ determined by the resistors 31 and 34 and the diode 32, an anode terminal and the cathode terminal of the diode 32 are not electrically connected to each other, and therefore the drive signal output circuit 15 does not output a drive signal to the gate terminal of the FET 23.

That is, under a condition in which a voltage obtained by subtracting the voltage drop amount $V_R$ in each of the resistors 31 and 34 from a drain voltage at the drain terminal of the E-type FET 11 is equal to or smaller than the forward drop voltage $V_{th,D}$ of the diode 32 of the drive signal output circuit 15, an anode terminal and a cathode terminal are not electrically connected to each other, and therefore the diode 32 does not output a drive signal from the cathode terminal to the gate terminal of the FET 23.

When the potential difference $V_1$ is larger than the threshold voltage $V_{th}$, the anode terminal and the cathode terminal of the diode 32 are electrically connected to each other, and therefore the drive signal output circuit 15 outputs a drive signal to the gate terminal of the FET 23.

That is, when a voltage obtained by subtracting the voltage drop amount $V_R$ in each of the resistors 31 and 34 from a drain voltage at the drain terminal of the E-type FET 11 is larger than the forward drop voltage $V_{th,D}$ of the diode 32 of the drive signal output circuit 15, an anode terminal and a cathode terminal are electrically connected to each other, and therefore the diode 32 outputs a drive signal from the cathode terminal to the gate terminal of the FET 23.

In the FET 23 of the power supply circuit 14, when a drive signal is output from the diode 32 of the drive signal output circuit 15, a potential of the gate terminal rises, and a current flowing between the drain terminal and the source terminal increases.

By the increase in current between the drain terminal and the source terminal of the FET 23, a potential between the resistor 24 and the resistor 25 rises, and a potential applied to the gate terminal of the E-type FET 11 rises.

At this time, since a load impedance in which the D-type FET 12 is estimated from the drain terminal of the E-type FET 11 does not change, a drain voltage of the E-type FET 11 decreases due to IV characteristics of the E-type FET 11, and a drain current increases.

Figure 2:
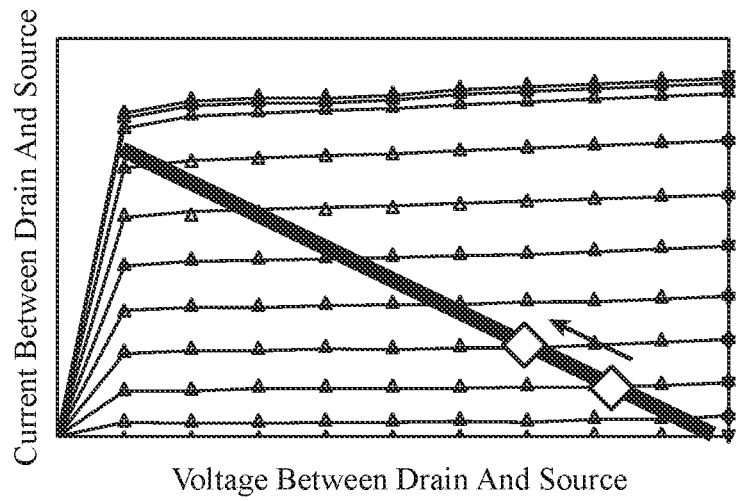
FIG. 2 is an explanatory graph illustrating IV characteristics of an E-type FET 11.

FIG. 2 is an explanatory graph illustrating IV characteristics of the E-type FET 11.

FIG. 2 illustrates, as IV characteristics of the E-type FET 11, a correspondence between a voltage between the drain terminal and the source terminal in the E-type FET 11 and a current flowing between the drain terminal and the source terminal in the E-type FET 11.

That is, FIG. 2 indicates that a rise in potential applied to the gate terminal of the E-type FET 11 decreases a voltage between the drain terminal and the source terminal in the E-type FET 11 and increases a current flowing between the drain terminal and the source terminal in the E-type FET 11.

When the drain voltage of the E-type FET 11 decreases, the potential difference $V_1$ between the source terminal of the E-type FET 11 and the source terminal of the D-type FET 12 decreases.

Therefore, by determining the threshold voltage $V_{th}$ to an appropriate value by the resistors 31 and 34 and the diode 32, it is possible to decrease a maximum value of the potential difference $V_1$ which is a voltage applied to the E-type FET 11.

As apparent from the above, according to the first embodiment, when the potential difference $V_1$ between the source terminal of the E-type FET 11 and the source terminal of the D-type FET 12 is larger than the threshold voltage $V_{th}$, the protection circuit 13 starts an operation to reduce the potential difference $V_1$ such that the potential difference $V_1$ is smaller than the threshold voltage $V_{th}$. Therefore, even when a signal to be amplified is an RF signal, destruction of the E-type FET 11 can be prevented.

That is, according to the first embodiment, the protection circuit 13 does not use a mechanical switch or the like having a speed slower than an RF signal, and uses the diode 32 and the FET 23 as a component which operates at a speed equal to or faster than a signal cycle of the RF signal. As a result, the protection circuit 13 immediately starts an operation to reduce the potential difference $V_1$ when the potential difference $V_1$ is larger than the threshold voltage $V_{th}$, and therefore destruction of the E-type FET 11 can be prevented even when a signal to be amplified is an RF signal.

Note that by forming all the high frequency amplifiers of FIG. 1 on one integrated circuit (IC), it is possible to achieve a small-sized high frequency amplifier resistant to failure.

In addition, since the low withstand voltage E-type FET 11 is used as the first transistor, and the high withstand voltage D-type FET 12 is used as the second transistor, a safe high frequency amplifier which is not easily destroyed can be obtained.

Figure 3:
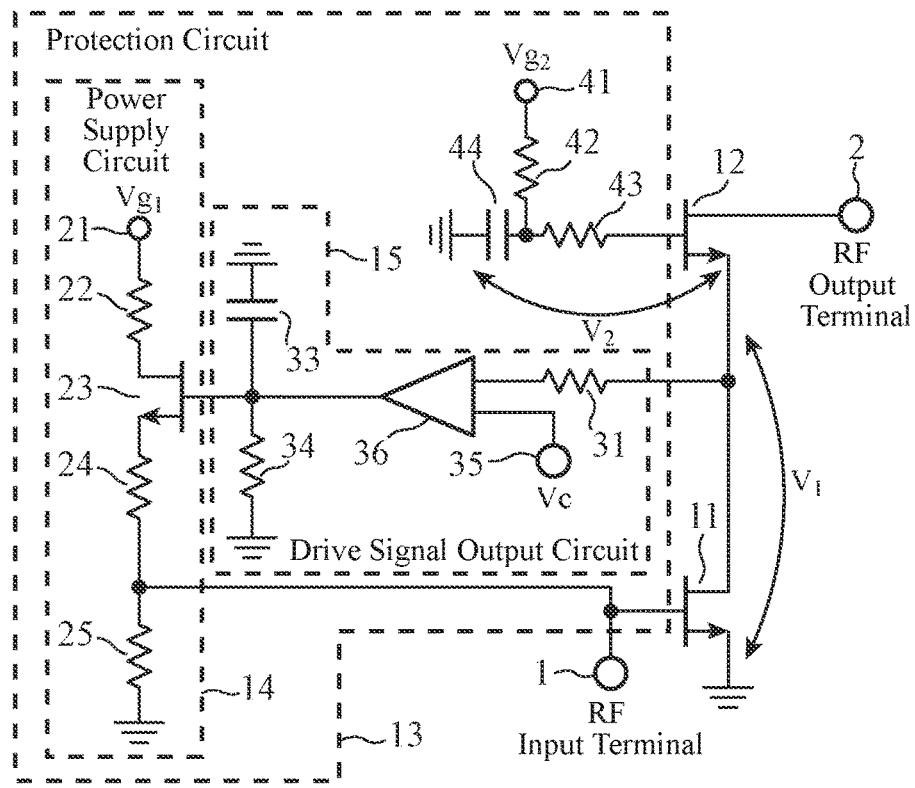
FIG. 3 is a configuration diagram illustrating another high frequency amplifier according to the first embodiment of the present invention.

The first embodiment illustrates an example in which the drive signal output circuit 15 includes the diode 32, but as illustrated in FIG. 3, the drive signal output circuit 15 may include a comparator 36 instead of the diode 32.

FIG. 3 is a configuration diagram illustrating another high frequency amplifier according to the first embodiment of the present invention. In FIG. 3, the same reference numerals as in FIG. 1 indicate the same or corresponding parts.

When the drive signal output circuit 15 includes the comparator 36, the comparator 36 compares a voltage obtained by subtracting a voltage drop amount in the resistor 31 from a drain voltage of the E-type FET 11 with a comparison voltage Vc input from a voltage input terminal 35. The comparison voltage Vc corresponds to a voltage lower than the threshold voltage $V_{th}$ by a voltage drop amount in the resistor 31.

Under a condition in which a voltage obtained by subtracting a voltage drop amount in the resistor 31 from a drain voltage of the E-type FET 11 is equal to or smaller than the comparison voltage Vc, the comparator 36 does not output a drive signal to the gate terminal of the FET 23.

The comparator 36 outputs a drive signal to the gate terminal of the FET 23 when the voltage obtained by subtracting a voltage drop amount in the resistor 31 from a drain voltage of the E-type FET 11 is larger than the comparison voltage Vc.

Although the drive signal output circuit 15 includes the comparator 36 in the example of FIG. 3, an operational amplifier may be used instead of the comparator 36. A configuration diagram in a case of using an operational amplifier instead of the comparator 36 is similar to FIG. 3.

Even when an operational amplifier is used instead of the comparator 36, a drive signal can be output to the gate terminal of the FET 23 only when a voltage obtained by subtracting a voltage drop amount in the resistor 31 from a drain voltage of the E-type FET 11 is larger than the comparison voltage Vc.

Figure 4:
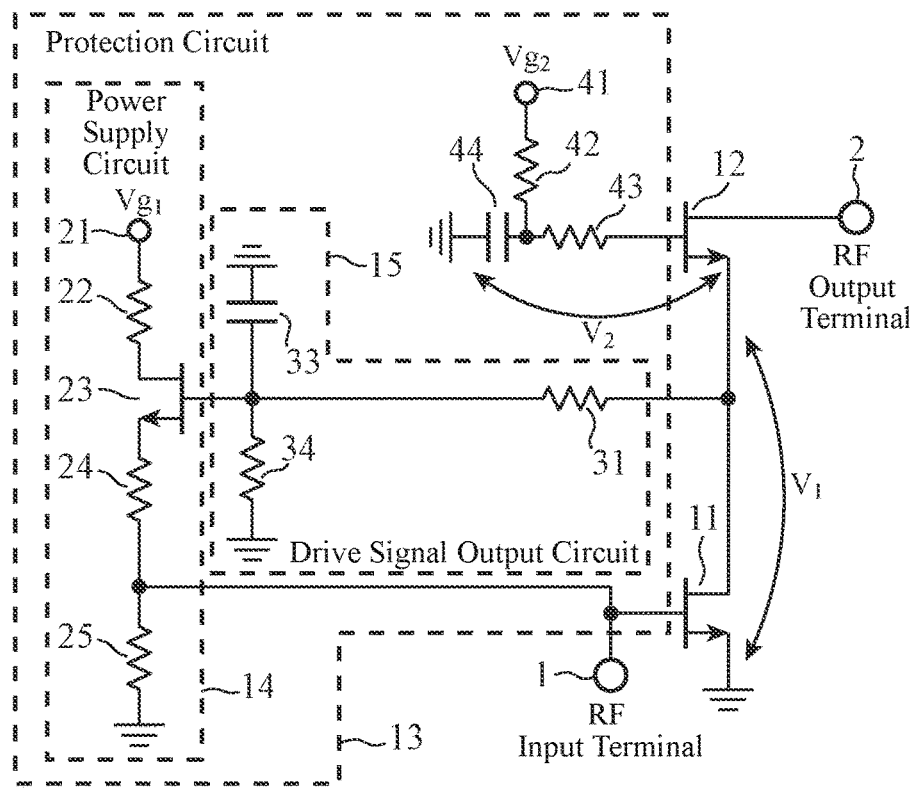
FIG. 4 is a configuration diagram illustrating another high frequency amplifier according to the first embodiment of the present invention.

The first embodiment illustrates an example in which the drive signal output circuit 15 includes the diode 32, but as illustrated in FIG. 4, the drive signal output circuit 15 does not necessarily have the diode 32 mounted thereon.

FIG. 4 is a configuration diagram illustrating another high frequency amplifier according to the first embodiment of the present invention. In FIG. 4, the same reference numerals as in FIG. 1 indicate the same or corresponding parts.

In a case where the drive signal output circuit 15 does not have the diode 32 mounted thereon, the potential difference $V_1$ is divided by the resistors 31 and 34, and when a voltage between both ends of the resistor 34 having a divided voltage is larger than a threshold voltage $V_{th,23}$ of the FET 23, operation is performed such that a gate voltage at the gate terminal of the E-type FET 11 rises.

As a result, the potential difference $V_1$ decrease, and therefore destruction of the E-type FET 11 can be prevented.

Figure 5:
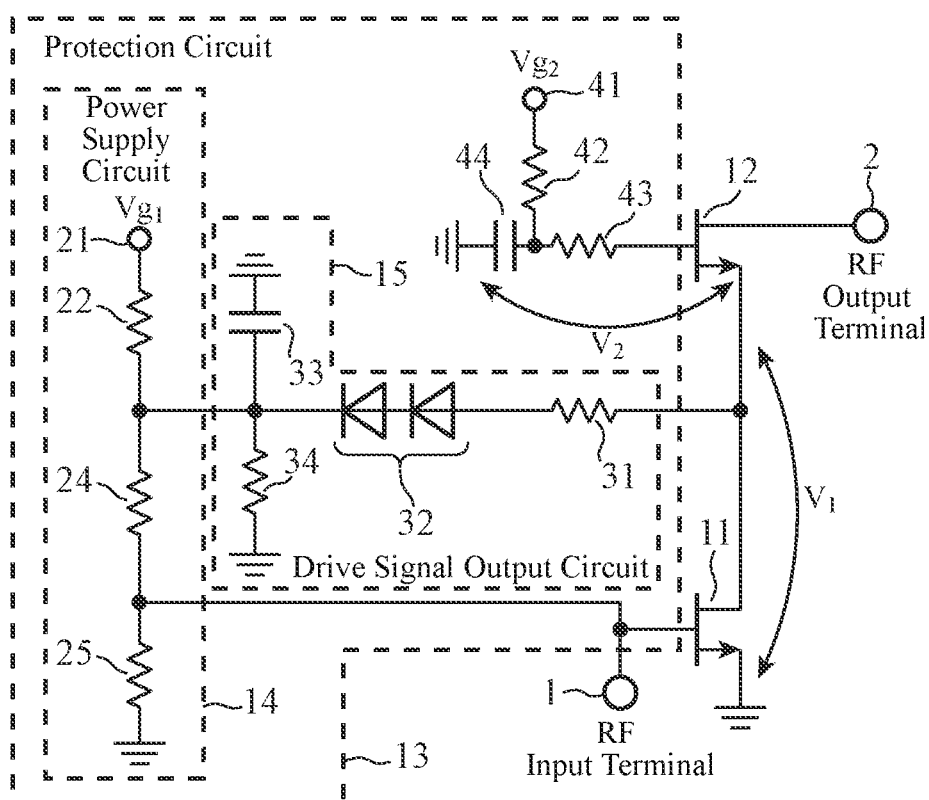
FIG. 5 is a configuration diagram illustrating another high frequency amplifier according to the first embodiment of the present invention.

The first embodiment illustrates an example in which the power supply circuit 14 includes the FET 23, but as illustrated in FIG. 5, the power supply circuit 14 does not necessarily have the FET 23 mounted thereon.

FIG. 5 is a configuration diagram illustrating another high frequency amplifier according to the first embodiment of the present invention. In FIG. 5, the same reference numerals as in FIG. 1 indicate the same or corresponding parts.

In a case where the power supply circuit 14 does not have the FET 23 mounted thereon, when the potential difference $V_1$ rises and a drive signal is output from the drive signal output circuit 15, the drive signal output from the drive signal output circuit 15 flows to the resistors 24 and 25.

Therefore, a potential between the resistor 24 and the resistor 25 is increased, and operation is performed such that a gate voltage at the gate terminal of the E-type FET 11 rises.

As a result, the potential difference $V_1$ decrease, and therefore destruction of the E-type FET 11 can be prevented.

Second Embodiment

The first embodiment illustrates an example in which the high frequency amplifier includes the power supply circuit 14 for increasing a voltage to be applied to the gate terminal of the E-type FET 11 when the potential difference $V_1$ between the source terminal of the E-type FET 11 and the source terminal of the D-type FET 12 is larger than the threshold voltage $V_{th}$.

A second embodiment illustrates an example in which a high frequency amplifier includes a power supply circuit 50 for reducing a voltage to be applied to the gate terminal of a D-type FET 12 when a potential difference $V_1$ between the source terminal of an E-type FET 11 and the source terminal of the D-type FET 12 is larger than a threshold voltage $V_{th}$.

Figure 6:
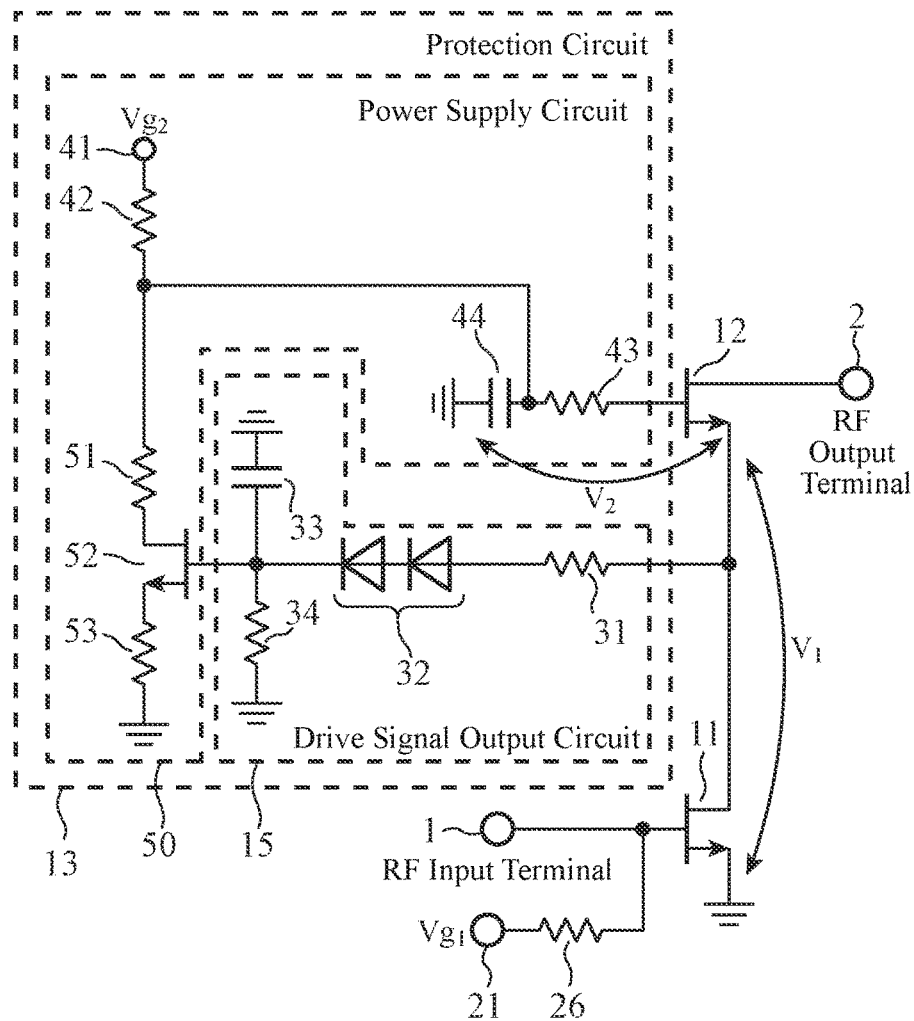
FIG. 6 is a configuration diagram illustrating a high frequency amplifier according to a second embodiment of the present invention.

FIG. 6 is a configuration diagram illustrating a high frequency amplifier according to the second embodiment of the present invention. In FIG. 6, the same reference numerals as in FIG. 1 indicate the same or corresponding parts, and therefore description thereof is omitted.

The second embodiment illustrates an example in which the first transistor is the E-type FET 11 as in the first embodiment, but the present invention is not limited to this case, and for example, the first transistor may be a BJT.

The second embodiment illustrates an example in which a second transistor is the D-type FET 12 as in the first embodiment, but the present invention is not limited to this case, and for example, the second transistor may be a BJT.

The resistor 26 has one end connected to a power supply terminal 21, and has the other end connected to the gate terminal of the E-type FET 11.

In the second embodiment, a protection circuit 13 includes the power supply circuit 50 and a drive signal output circuit 15.

The power supply circuit 50 includes a power supply terminal 41, a resistor 42, a resistor 43, a capacitor 44, a resistor 51, an FET 52, and a resistor 53.

The power supply circuit 50 is a circuit for applying a voltage to the gate terminal of the D-type FET 12, and operates to reduce a voltage to be applied to the gate terminal of the D-type FET 12 when the potential difference $V_1$ between the source terminal of the E-type FET 11 and the source terminal of the D-type FET 12 is larger than the threshold voltage $V_{th}$.

The resistor 51 is a second resistor having one end connected to the other end of the resistor 42.

The FET 52 is a third transistor having a drain terminal connected to the other end of the resistor 51 and having a gate terminal connected to the other end of the drive signal output circuit 15.

The second embodiment illustrates an example in which the third transistor is the FET 52, but the present invention is not limited to this case, and for example, the third transistor may be a BJT.

When the third transistor is a BJT, a collector terminal of the BJT is connected to the other end of the resistor 51, and the base terminal is connected to the other end of the drive signal output circuit 15.

The resistor 53 is a third resistor having one end connected to the source terminal of the FET 52 and having the other end connected to the ground.

In the second embodiment, the resistor 42 is a first resistor, and the resistor 43 is a fourth resistor.

Next, operation will be described.

Under a condition in which the potential difference $V_1$ between the source terminal of the E-type FET 11 and the source terminal of the D-type FET 12 is equal to or smaller than the threshold voltage $V_{th}$ determined by the resistors 31 and 34 and the diode 32, an anode terminal and a cathode terminal of the diode 32 are not electrically connected to each other, and therefore the drive signal output circuit 15 does not output a drive signal to the gate terminal of the FET 52.

That is, under a condition in which a voltage obtained by subtracting a voltage drop amount in each of the resistors 31 and 34 from a drain voltage of the E-type FET 11 is equal to or smaller than a forward drop voltage $V_{th,D}$ of the diode 32 of the drive signal output circuit 15, an anode terminal and a cathode terminal are not electrically connected to each other, and therefore the diode 32 does not output a drive signal from the cathode terminal to the gate terminal of the FET 52.

When the potential difference $V_1$ is larger than the threshold voltage $V_{th}$, an anode terminal and the cathode terminal of the diode 32 are electrically connected to each other, and therefore the drive signal output circuit 15 outputs a drive signal to the gate terminal of the FET 52.

That is, when a voltage obtained by subtracting a voltage drop amount in each of the resistors 31 and 34 from a drain voltage of the E-type FET 11 is larger than the forward drop voltage $V_{th,D}$ of the diode 32 of the drive signal output circuit 15, an anode terminal and a cathode terminal are electrically connected to each other, and therefore the diode 32 outputs a drive signal from the cathode terminal to the gate terminal of the FET 52.

In the FET 52 of the power supply circuit 50, when a drive signal is output from the diode 32 of the drive signal output circuit 15, a potential of the gate terminal rises, and a current flowing between the drain terminal and a source terminal increases.

By the increase in current flowing between the drain terminal and the source terminal of the FET 52, voltage drop in the resistor 42 increases, and a gate voltage at the gate terminal of the D-type FET 12 decreases.

At this time, since a load impedance in which the RF output terminal 2 side is estimated from the drain terminal of the D-type FET 12 does not change, a drain voltage of the D-type FET 12 increases due to IV characteristics of the D-type FET 12, and a drain current decreases.

Figure 7:
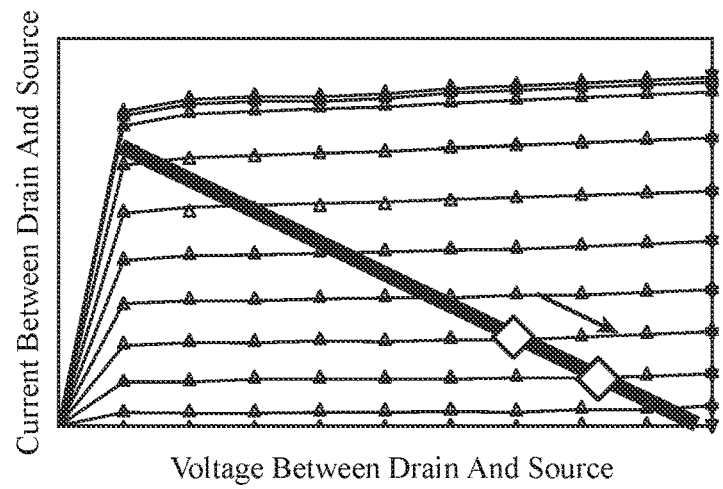
FIG. 7 is an explanatory graph illustrating IV characteristics of a D-type FET 12.

FIG. 7 is an explanatory graph illustrating IV characteristics of the D-type FET 12.

FIG. 7 illustrates, as IV characteristics of the D-type FET 12, a correspondence between a voltage between the drain terminal and the source terminal in the D-type FET 12 and a current flowing between the drain terminal and the source terminal in the D-type FET 12.

That is, FIG. 7 indicates that a decrease in voltage applied to the gate terminal of the D-type FET 12 increases a voltage between the drain terminal and the source terminal in the D-type FET 12 and decreases a current flowing between the drain terminal and the source terminal in the D-type FET 12.

When a drain voltage of the D-type FET 12 increases and a drain current decreases, the potential difference $V_1$ between the source terminal of the E-type FET 11 and the source terminal of the D-type FET 12 decreases.

Therefore, by determining the threshold voltage $V_{th}$ to an appropriate value by the resistors 31 and 34 and the diode 32, it is possible to decrease a maximum value of the potential difference $V_1$ which is a voltage applied to the E-type FET 11.

As apparent from the above, according to the second embodiment, when the potential difference $V_1$ between the source terminal of the E-type FET 11 and the source terminal of the D-type FET 12 is larger than the threshold voltage $V_{th}$, the protection circuit 13 starts an operation to reduce the potential difference $V_1$ such that the potential difference $V_1$ is smaller than the threshold voltage $V_{th}$. Therefore, even when a signal to be amplified is an RF signal, destruction of the E-type FET 11 can be prevented.

Figure 8:
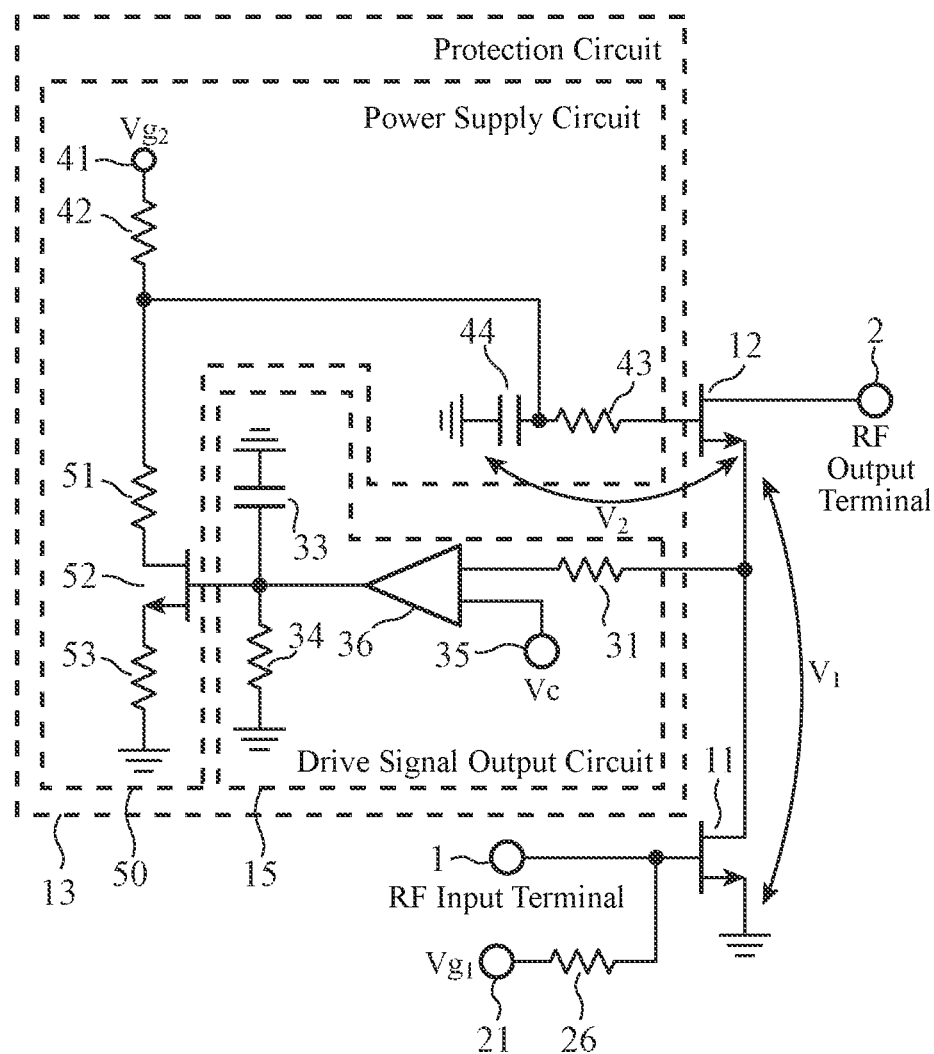
FIG. 8 is a configuration diagram illustrating another high frequency amplifier according to the second embodiment of the present invention.

The second embodiment illustrates an example in which the drive signal output circuit 15 includes the diode 32, but as illustrated in FIG. 8, the drive signal output circuit 15 may include a comparator 36 instead of the diode 32.

FIG. 8 is a configuration diagram illustrating another high frequency amplifier according to the second embodiment of the present invention. In FIG. 8, the same reference numerals as in FIG. 6 indicate the same or corresponding parts.

When the drive signal output circuit 15 includes the comparator 36, the comparator 36 compares a voltage obtained by subtracting a voltage drop amount in the resistor 31 from a drain voltage of the E-type FET 11 with a comparison voltage Vc input from a voltage input terminal 35.

Under a condition in which the voltage obtained by subtracting the voltage drop amount in the resistor 31 from the drain voltage of the E-type FET 11 is equal to or smaller than the comparison voltage Vc, the comparator 36 does not output a drive signal to the gate terminal of the FET 52.

When the voltage obtained by subtracting the voltage drop amount in the resistor 31 from the drain voltage of the E-type FET 11 is larger than the comparison voltage Vc, the comparator 36 outputs a drive signal to the gate terminal of the FET 52.

Although the drive signal output circuit 15 includes the comparator 36 in the example of FIG. 8, an operational amplifier may be used instead of the comparator 36. A configuration diagram in the case of using an operational amplifier instead of the comparator 36 is similar to FIG. 8.

Even when an operational amplifier is used instead of the comparator 36, a drive signal can be output to the gate terminal of the FET 52 only when the voltage obtained by subtracting the voltage drop amount in the resistor 31 from the drain voltage of the E-type FET 11 is larger than the comparison voltage Vc.

Figure 9:
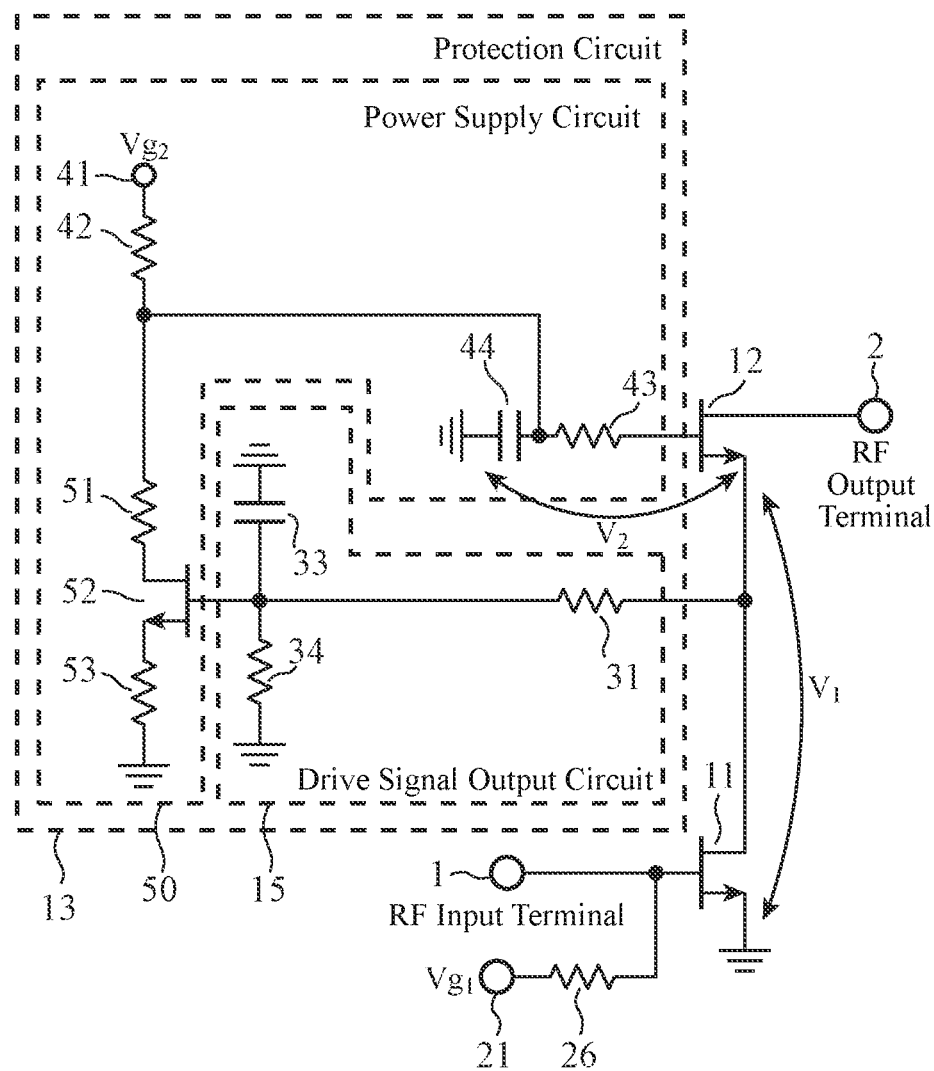
FIG. 9 is a configuration diagram illustrating another high frequency amplifier according to the second embodiment of the present invention.

The second embodiment illustrates an example in which the drive signal output circuit 15 includes the diode 32, but as illustrated in FIG. 9, the drive signal output circuit 15 does not necessarily have the diode 32 mounted thereon.

FIG. 9 is a configuration diagram illustrating another high frequency amplifier according to the second embodiment of the present invention. In FIG. 9, the same reference numerals as in FIG. 6 indicate the same or corresponding parts.

In a case where the drive signal output circuit 15 does not have the diode 32 mounted thereon, when a potential obtained by subtracting a voltage drop amount in each of the resistors 31 and 53 from the potential difference $V_1$ is larger than a threshold voltage $V_{th,52}$ of the FET 52, operation is performed such that a gate voltage at the gate terminal of the D-type FET 12 decreases.

As a result, the potential difference $V_1$ decrease, and therefore destruction of the E-type FET 11 can be prevented.

Third Embodiment

A third embodiment illustrates an example in which a power supply circuit 60 includes a varactor diode 69.

Figure 10:
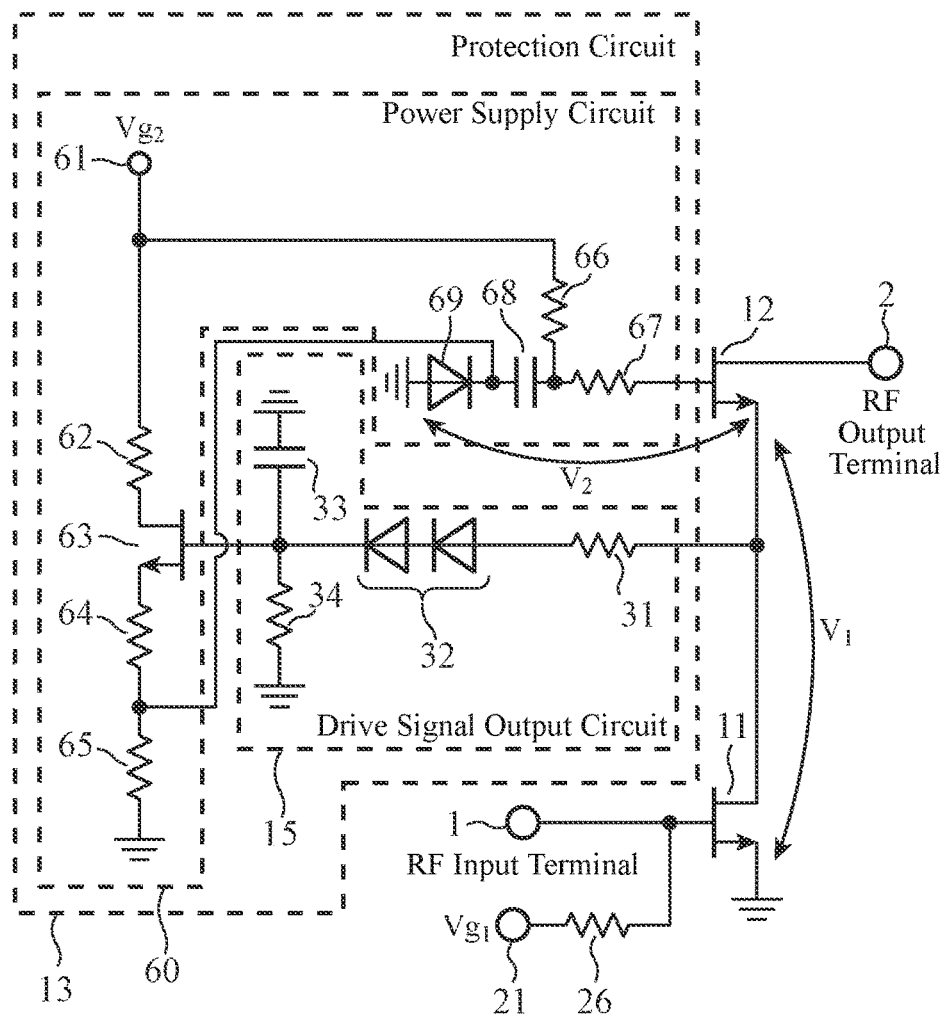
FIG. 10 is a configuration diagram illustrating a high frequency amplifier according to a third embodiment of the present invention.

FIG. 10 is a configuration diagram illustrating a high frequency amplifier according to the third embodiment of the present invention. In FIG. 10, the same reference numerals as in FIG. 1 indicate the same or corresponding parts, and therefore description thereof is omitted.

The third embodiment illustrates an example in which a first transistor is an E-type FET 11 as in the first and second embodiments, but the present invention is not limited to this case, and for example, the first transistor may be a BJT.

The third embodiment illustrates an example in which a second transistor is a D-type FET 12 as in the first and second embodiments, but the present invention is not limited to this case, and for example, the second transistor may be a BJT.

In the third embodiment, a protection circuit 13 includes a power supply circuit 60 and a drive signal output circuit 15.

The power supply circuit 60 includes a power supply terminal 61, a resistor 62, an FET 63, resistors 64 to 67, a capacitor 68, and a varactor diode 69.

The power supply circuit 60 is a circuit for applying a voltage to the gate terminal of the D-type FET 12, and operates to reduce a voltage to be applied to the gate terminal of the D-type FET 12 when a potential difference $V_1$ between the source terminal of the E-type FET 11 and the source terminal of the D-type FET 12 is larger than a threshold voltage $V_{th}$.

The power supply terminal 61 is a terminal to which a fixed voltage $Vg_2$ is applied.

The resistor 62 is a first resistor having one end connected to the power supply terminal 61.

The FET 63 is a third transistor having a drain terminal connected to the other end of the resistor 62 and having a gate terminal connected to the other end of the drive signal output circuit 15.

The third embodiment illustrates an example in which the third transistor is the FET 63, but the present invention is not limited to this case, and for example, the third transistor may be a BJT.

When the third transistor is a BJT, the collector terminal of the BJT is connected to the other end of the resistor 62, and a base terminal is connected to the other end of the drive signal output circuit 15.

The resistor 64 is a second resistor having one end connected to the source terminal of the FET 63.

The resistor 65 is a third resistor having one end connected to the other end of the resistor 64 and having the other end connected to the ground.

The resistor 66 is a fourth resistor having one end connected to the power supply terminal 61.

The resistor 67 is a fifth resistor having one end connected to the other end of the resistor 66 and having the other end connected to the gate terminal of the D-type FET 12.

The capacitor 68 has one end connected to the other end of the resistor 66, and has the other end connected between the other end of the resistor 64 and one end of the resistor 65.

The varactor diode 69 has an anode terminal connected to the ground and has a cathode terminal connected to the other end of the capacitor 68.

In FIG. 10, a potential difference obtained by summing up a potential difference between both ends of the resistor 67, a potential difference between both ends of the capacitor 68, a potential difference between both ends of the varactor diode 69, and a potential difference between the gate terminal and the source terminal of the D-type FET 12 is represented by $V_2$.

Next, operation will be described.

In the FET 63 of the power supply circuit 60, when a drive signal is output from the diode 32 of the drive signal output circuit 15, a potential of the gate terminal rises, and a current flowing between the drain terminal and the source terminal increases.

By the increase in current flowing between the drain terminal and the source terminal of the FET 63, a potential between the resistor 64 and the resistor 65 rises, and a potential difference between both ends of the varactor diode 69 increases.

Figure 11:
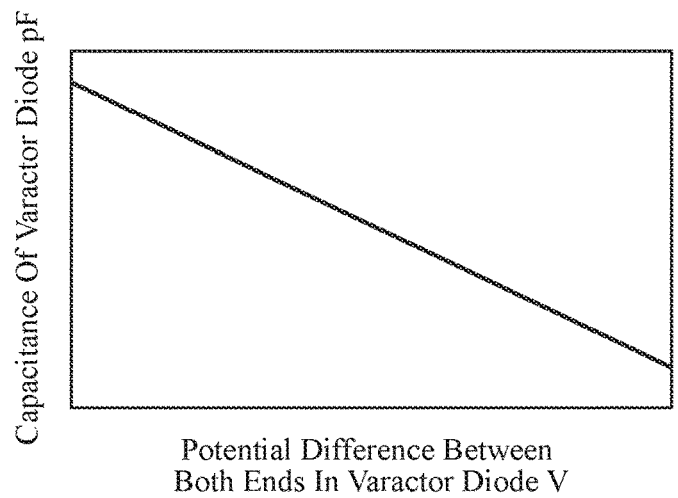
FIG. 11 is an explanatory graph illustrating a relationship between a potential difference between both ends and capacitance in a varactor diode 69.

FIG. 11 is an explanatory graph illustrating a relationship between a potential difference between both ends and capacitance in the varactor diode 69.

The varactor diode 69 has a relationship between a potential difference between both ends and capacitance as illustrated in FIG. 11, and therefore decreases the capacitance when the potential difference between both ends increases.

When the capacitance of the varactor diode 69 decreases, the potential difference between both ends in the varactor diode 69 at a high frequency further increases, and a gate voltage at the gate terminal of the D-type FET 12 decreases.

At this time, since a load impedance in which the RF output terminal 2 side is estimated from the drain terminal of the D-type FET 12 does not change, a drain voltage of the D-type FET 12 increases due to IV characteristics of the D-type FET 12 as illustrated in FIG. 7, and a drain current of the FET 12 decreases.

When a drain voltage of the D-type FET 12 increases and a drain current decreases, the potential difference $V_1$ between the source terminal of the E-type FET 11 and the source terminal of the D-type FET 12 decreases.

Therefore, by determining the threshold voltage $V_{th}$ to an appropriate value by the resistors 31 and 34 and the diode 32, it is possible to decrease a maximum value of the potential difference $V_1$ which is a voltage applied to the E-type FET 11.

As a result, according to the third embodiment, as in the first and second embodiments, even when a signal to be amplified is an RF signal, destruction of the E-type FET 11 can be prevented.

The third embodiment illustrates an example in which the drive signal output circuit 15 includes the diode 32, but as in the first and second embodiments, the drive signal output circuit 15 may include a comparator 36 instead of the diode 32.

Figure 12:
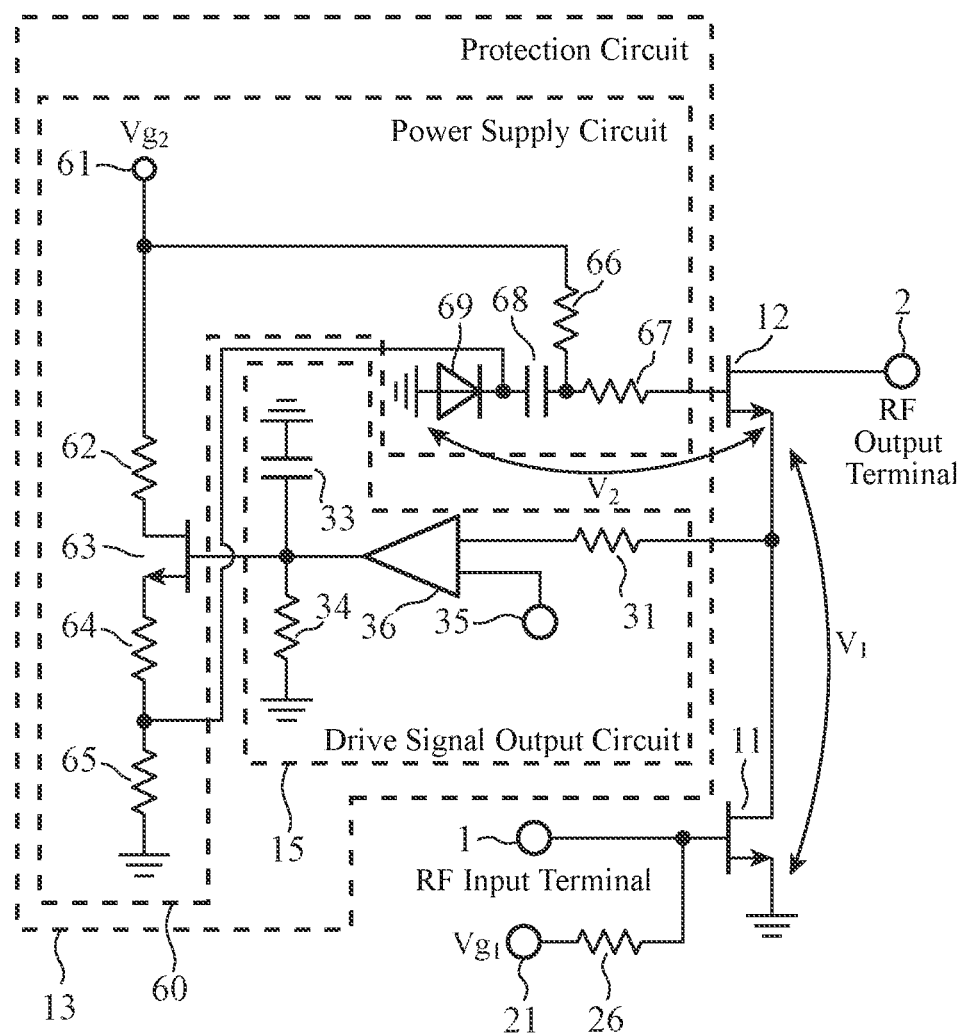
FIG. 12 is a configuration diagram illustrating another high frequency amplifier according to the third embodiment of the present invention.

FIG. 12 is a configuration diagram illustrating another high frequency amplifier according to the third embodiment of the present invention. In FIG. 12, the same reference numerals as in FIG. 10 indicate the same or corresponding parts.

Although the drive signal output circuit 15 includes the comparator 36 in the example of FIG. 12, an operational amplifier may be used instead of the comparator 36. A configuration diagram in the case of using an operational amplifier instead of the comparator 36 is similar to FIG. 12.

Even when the comparator 36 or an operational amplifier is used instead of the diode 32, a drive signal can be output to the gate terminal of the FET 52 only when a voltage obtained by subtracting a voltage drop amount in the resistor 31 from a drain voltage of the E-type FET 11 is larger than a comparison voltage Vc.

The third embodiment illustrates an example in which the drive signal output circuit 15 includes the diode 32, but as in the first embodiment, the drive signal output circuit 15 does not necessarily have the diode 32 mounted thereon.

Figure 13:
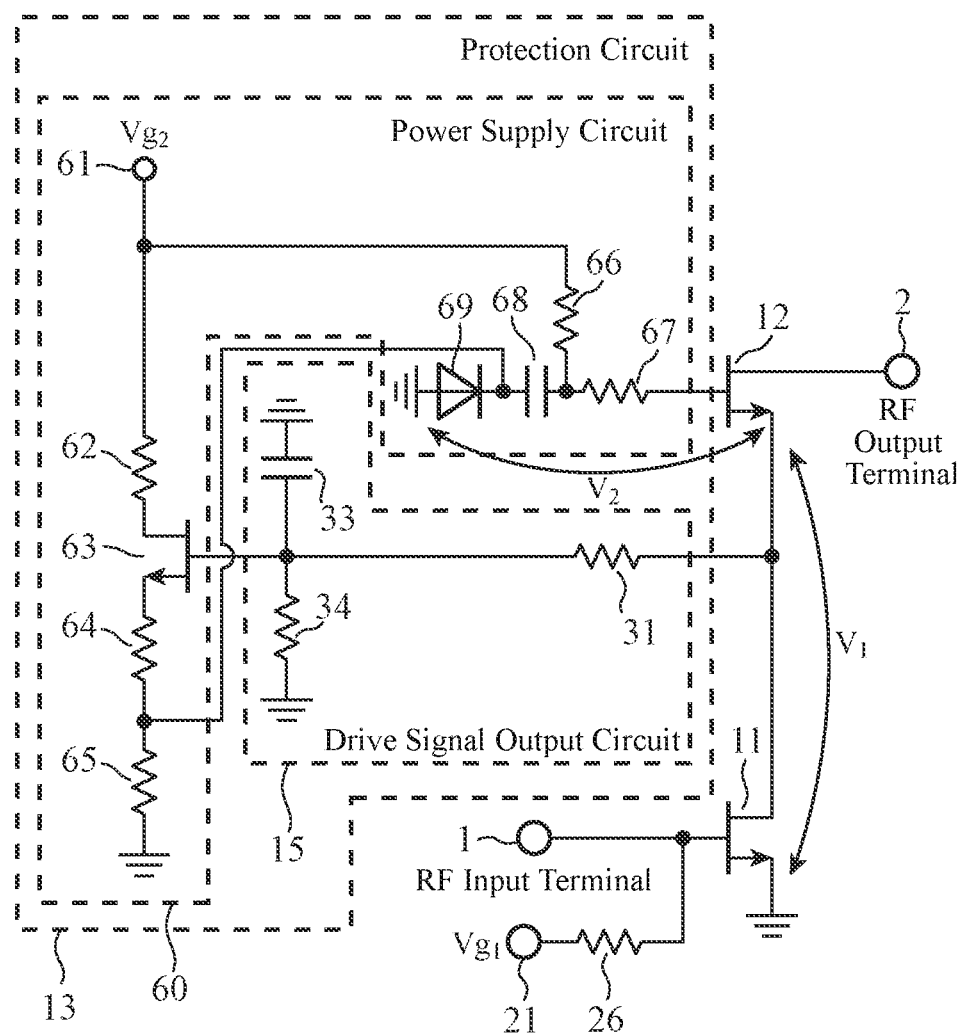
FIG. 13 is a configuration diagram illustrating another high frequency amplifier according to the third embodiment of the present invention.

FIG. 13 is a configuration diagram illustrating another high frequency amplifier according to the third embodiment of the present invention. In FIG. 13, the same reference numerals as in FIG. 10 indicate the same or corresponding parts.

In a case where the drive signal output circuit 15 does not have the diode 32 mounted thereon, when a potential obtained by subtracting a voltage drop amount in each of the resistors 31, 64, and 65 from a drain voltage of the E-type FET 11 is larger than a threshold voltage $V_{th,63}$ of the FET 63, operation is performed such that a gate voltage at the gate terminal of the D-type FET 12 decreases.

Figure 14:
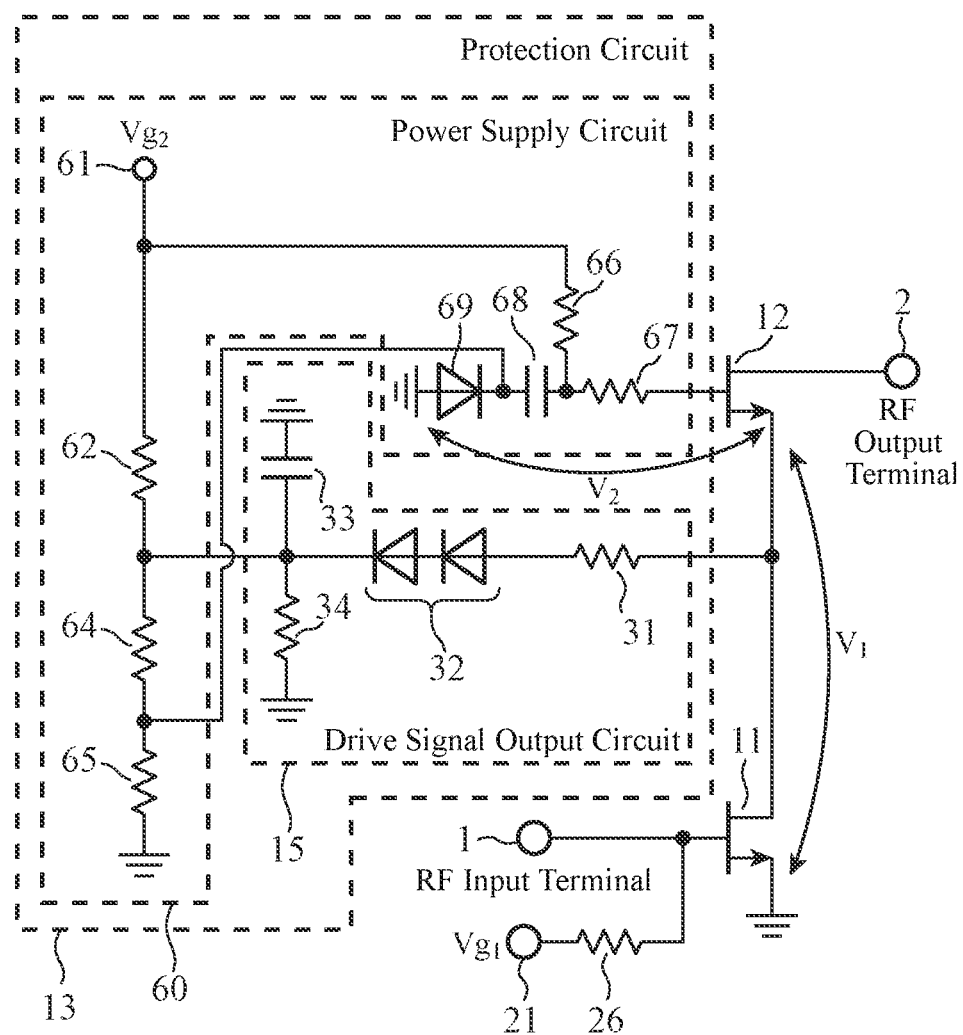
FIG. 14 is a configuration diagram illustrating another high frequency amplifier according to the third embodiment of the present invention.

The third embodiment illustrates an example in which the power supply circuit 60 includes the FET 63, but as illustrated in FIG. 14, the power supply circuit 60 does not necessarily have the FET 63 mounted thereon.

FIG. 14 is a configuration diagram illustrating another high frequency amplifier according to the third embodiment of the present invention. In FIG. 14, the same reference numerals as in FIG. 10 indicate the same or corresponding parts.

In a case where the power supply circuit 60 does not have the FET 63 mounted thereon, when the potential difference $V_1$ rises and a drive signal is output from the drive signal output circuit 15, the drive signal output from the drive signal output circuit 15 flows to the resistors 64 and 65.

Therefore, operation is performed such that a potential between the resistor 64 and the resistor 65 is increased, and a gate voltage at the gate terminal of the D-type FET 12 decreases.

Fourth Embodiment

A fourth embodiment illustrates an example in which a power supply circuit 70 includes an FET 72.

Figure 15:
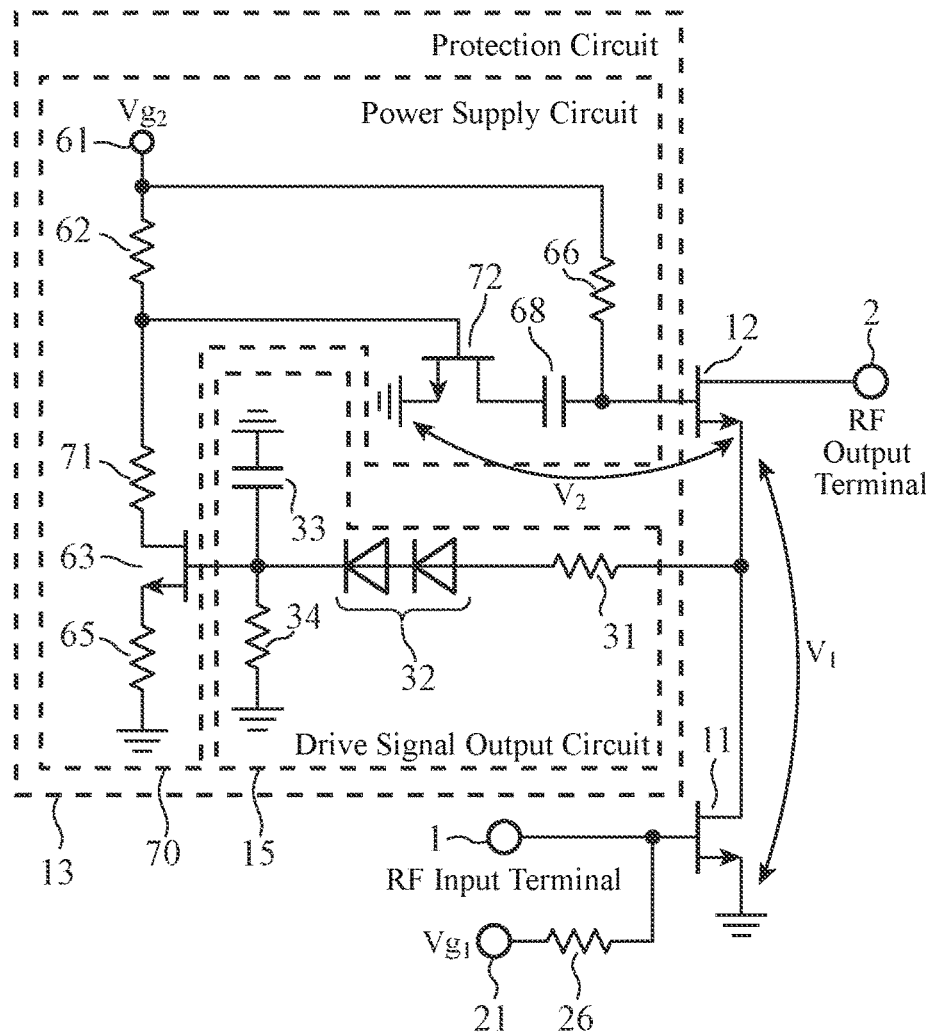
FIG. 15 is a configuration diagram illustrating a high frequency amplifier according to a fourth embodiment of the present invention.

FIG. 15 is a configuration diagram illustrating a high frequency amplifier according to the fourth embodiment of the present invention. In FIG. 15, the same reference numerals as in FIG. 10 indicate the same or corresponding parts, and therefore description thereof is omitted.

The fourth embodiment illustrates an example in which a first transistor is an E-type FET 11 as in the first to third embodiments, but the present invention is not limited to this case, and for example, the first transistor may be a BJT.

The fourth embodiment illustrates an example in which a second transistor is a D-type FET 12 as in the first to third embodiments, but the present invention is not limited to this case, and for example, the second transistor may be a BJT.

In the fourth embodiment, a protection circuit 13 includes a power supply circuit 70 and a drive signal output circuit 15.

The power supply circuit 70 includes a power supply terminal 61, resistors 62 and 71, an FET 63, resistors 65 and 66, a capacitor 68, and the FET 72.

The power supply circuit 70 is a circuit for applying a voltage to the gate terminal of the D-type FET 12, and operates to reduce a voltage to be applied to the gate terminal of the D-type FET 12 when a potential difference $V_1$ between the source terminal of the E-type FET 11 and the source terminal of the D-type FET 12 is larger than a threshold voltage $V_{th}$.

The resistor 71 is a second resistor having one end connected to the other end of the resistor 62 and having the other end connected to the drain terminal of the FET 63.

The FET 72 is a fourth transistor having a drain terminal connected to the other end of the capacitor 68, having a gate terminal connected to the other end of the resistor 62, and having a source terminal connected to the ground.

The fourth embodiment illustrates an example in which the fourth transistor is the FET 72, but the present invention is not limited to this case, and for example, the fourth transistor may be a BJT.

When the fourth transistor is a BJT, a collector terminal of the BJT is connected to the other end of the capacitor 68, a base terminal is connected to the other end of the resistor 62, and an emitter terminal is connected to the ground.

Next, operation will be described.

In the FET 63 of the power supply circuit 60, when a drive signal is output from the diode 32 of the drive signal output circuit 15, a potential of the gate terminal rises, and a current flowing between the drain terminal and a source terminal increases.

By the increase in current flowing between the drain terminal and the source terminal of the FET 63, voltage drop in the resistor 62 increases, and a gate voltage at the gate terminal of the FET 72 decreases.

Figure 16:
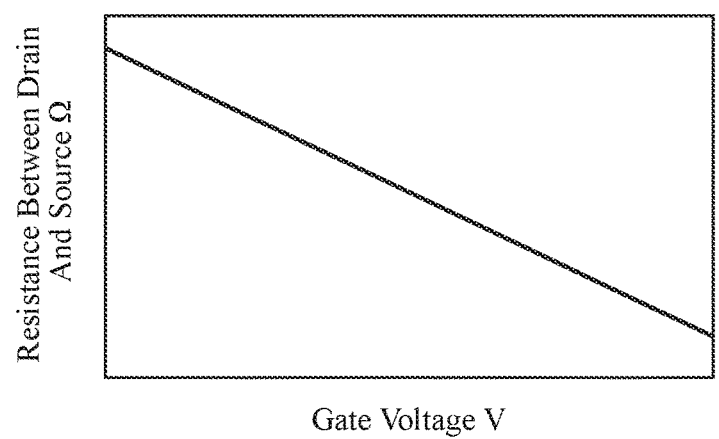
FIG. 16 is an explanatory graph illustrating a correspondence between a gate voltage of a gate terminal and a resistance value between a drain terminal and a source terminal in an FET 72.

FIG. 16 is an explanatory graph illustrating a correspondence between the gate voltage at the gate terminal and a resistance value between the drain terminal and the source terminal in the FET 72.

The FET 72 has a relationship between the gate voltage at the gate terminal and the resistance value as illustrated in FIG. 11, and therefore when the gate voltage at the gate terminal decreases, the resistance value between the drain terminal and the source terminal increases.

When the resistance value between the drain terminal and the source terminal in the FET 72 increases, a potential difference between the drain terminal and the source terminal in the FET 72 at a high frequency increases, and a gate voltage at the gate terminal of the D-type FET 12 decreases.

At this time, since a load impedance in which the RF output terminal 2 side is estimated from the drain terminal of the D-type FET 12 does not change, a drain voltage of the D-type FET 12 increases due to IV characteristics of the D-type FET 12 as illustrated in FIG. 7, and a drain current of the FET 12 decreases.

When a drain voltage of the D-type FET 12 increases and a drain current decreases, the potential difference $V_1$ between the source terminal of the E-type FET 11 and the source terminal of the D-type FET 12 decreases.

Therefore, by determining the threshold voltage $V_{th}$ to an appropriate value by the resistors 31 and 34 and the diode 32, it is possible to decrease a maximum value of the potential difference $V_1$ which is a voltage applied to the E-type FET 11.

As a result, according to the fourth embodiment, as in the first to third embodiments, even when a signal to be amplified is an RF signal, destruction of the E-type FET 11 can be prevented.

The fourth embodiment illustrates an example in which the drive signal output circuit 15 includes the diode 32, but as in the first to third embodiments, the drive signal output circuit 15 may include a comparator 36 instead of the diode 32.

Figure 17:
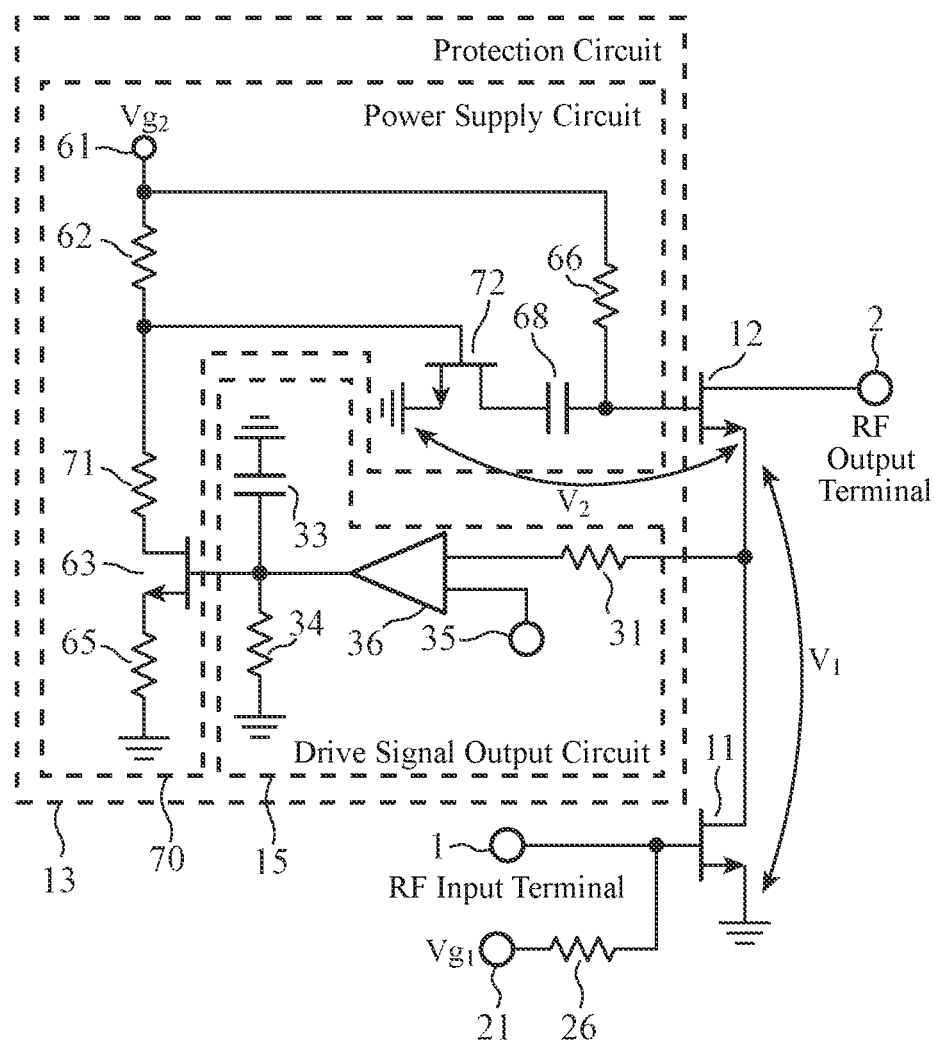
FIG. 17 is a configuration diagram illustrating another high frequency amplifier according to the fourth embodiment of the present invention.

FIG. 17 is a configuration diagram illustrating another high frequency amplifier according to the fourth embodiment of the present invention. In FIG. 17, the same reference numerals as in FIG. 15 indicate the same or corresponding parts.

Although the drive signal output circuit 15 includes the comparator 36 in the example of FIG. 17, an operational amplifier may be used instead of the comparator 36. A configuration diagram in the case of using an operational amplifier instead of the comparator 36 is similar to FIG. 17.

Even when the comparator 36 or an operational amplifier is used instead of the diode 32, a drive signal can be output to the gate terminal of the FET 63 only when a voltage obtained by subtracting a voltage drop amount in the resistor 31 from a drain voltage of the E-type FET 11 is larger than a comparison voltage Vc.

The fourth embodiment illustrates an example in which the drive signal output circuit 15 includes the diode 32, but as in the first to third embodiments, the drive signal output circuit 15 does not necessarily have the diode 32 mounted thereon.

Figure 18:
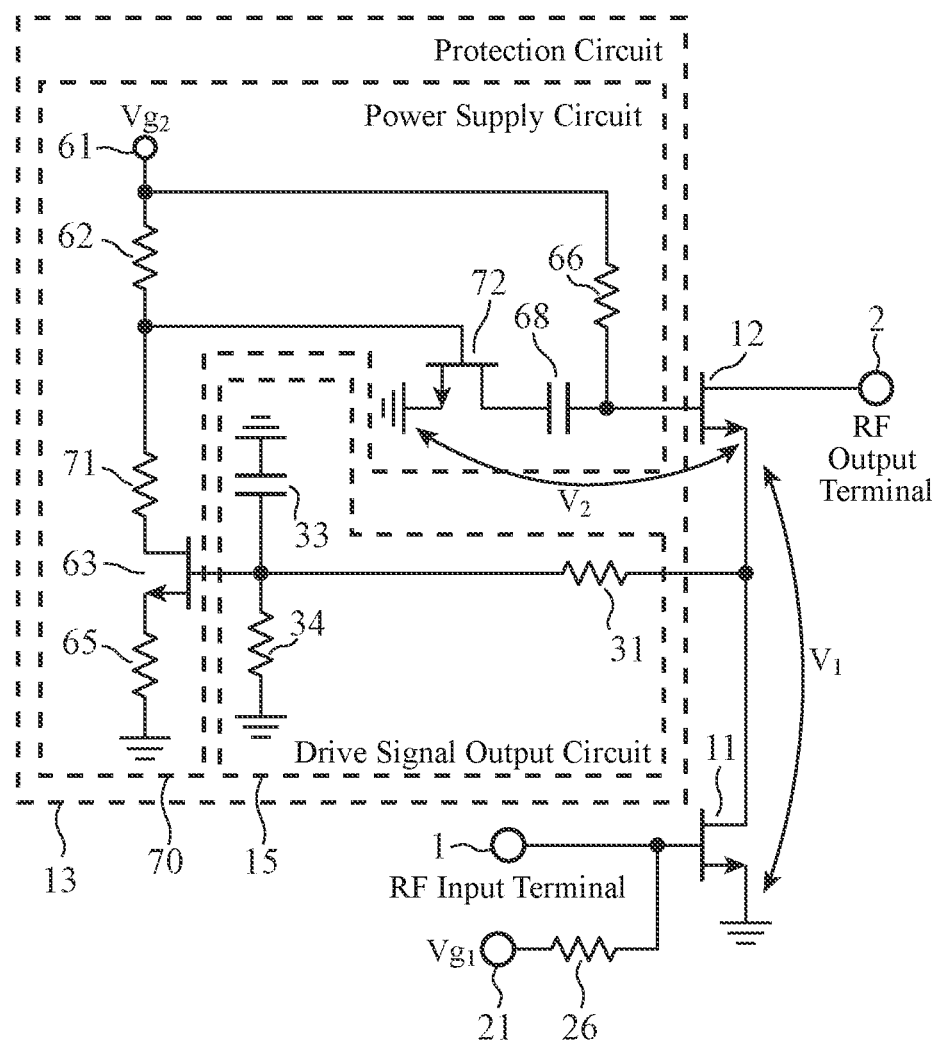
FIG. 18 is a configuration diagram illustrating another high frequency amplifier according to the fourth embodiment of the present invention.

FIG. 18 is a configuration diagram illustrating another high frequency amplifier according to the fourth embodiment of the present invention. In FIG. 18, the same reference numerals as in FIG. 15 indicate the same or corresponding parts.

In a case where the drive signal output circuit 15 does not have the diode 32 mounted thereon, when a potential obtained by subtracting a voltage drop amount in each of the resistors 31 and 65 from a drain voltage of the E-type FET 11 is larger than a threshold voltage $V_{th,63}$ of the FET 63, a resistance value between the drain terminal and the source terminal in the FET 72 increases, and a gate voltage at the gate terminal of the D-type FET 12 decreases.

Fifth Embodiment

The first embodiment illustrates an example in which the high frequency amplifier includes the power supply circuit 14 for applying a voltage to the gate terminal of the E-type FET 11.

A fifth embodiment illustrates an example in which a high frequency amplifier includes an impedance adjusting circuit 80 for adjusting an impedance between the drain terminal of an E-type FET 11 and the drain terminal of a D-type FET 12.

Figure 19:
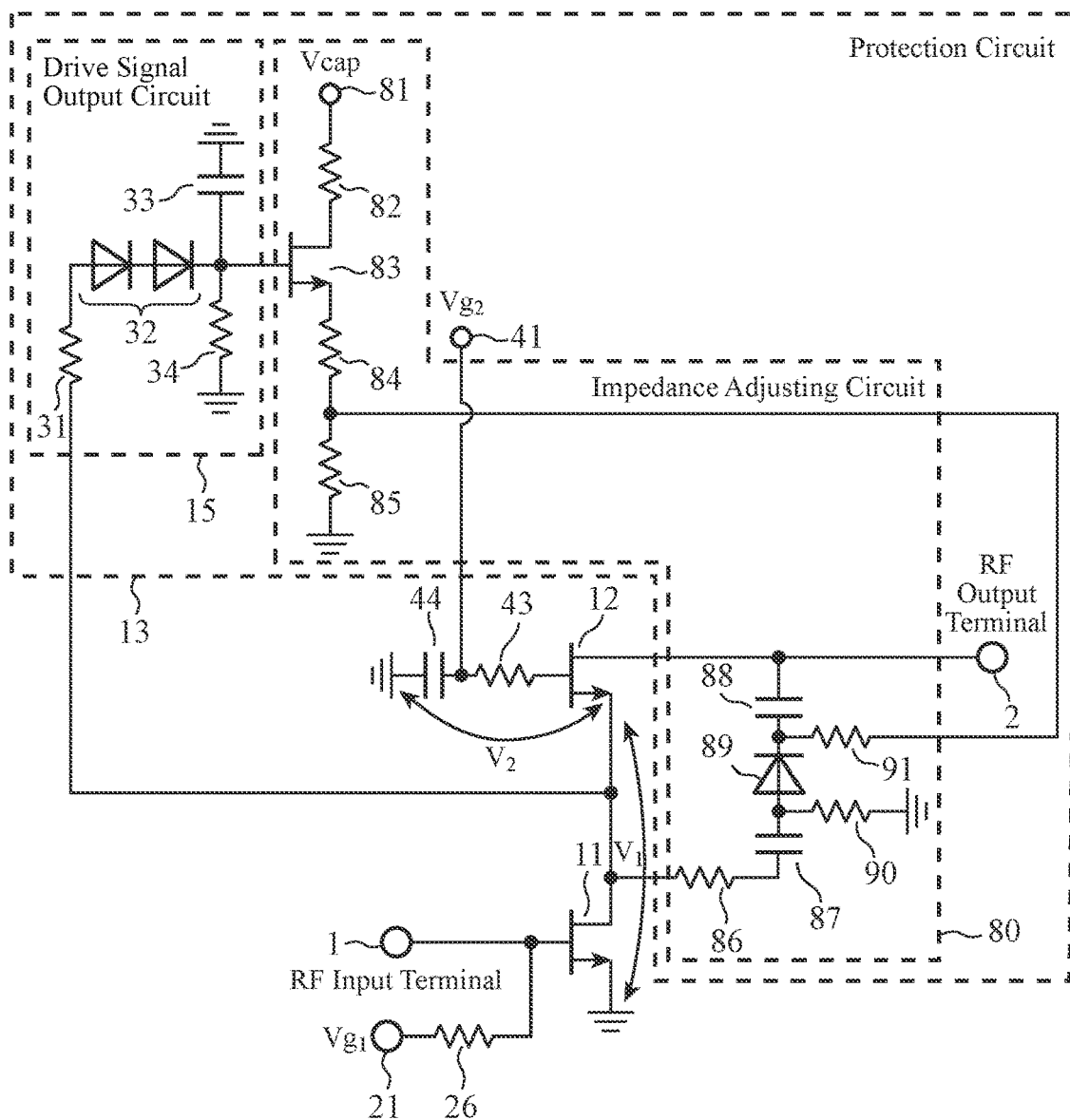
FIG. 19 is a configuration diagram illustrating a high frequency amplifier according to a fifth embodiment of the present invention.

FIG. 19 is a configuration diagram illustrating a high frequency amplifier according to the fifth embodiment of the present invention. In FIG. 19, the same reference numerals as in FIG. 1 indicate the same or corresponding parts, and therefore description thereof is omitted.

The fifth embodiment illustrates an example in which a first transistor is an E-type FET 11 as in the first embodiment, but the present invention is not limited to this case, and for example, the first transistor may be a BJT.

The fifth embodiment illustrates an example in which a second transistor is a D-type FET 12 as in the first embodiment, but the present invention is not limited to this case, and for example, the second transistor may be a BJT.

The impedance adjusting circuit 80 is a circuit for increasing an impedance between the drain terminal of the E-type FET 11 and the drain terminal of the D-type FET 12 when a potential difference $V_1$ between the source terminal of the E-type FET 11 and the source terminal of the D-type FET 12 is larger than a threshold voltage $V_{th}$.

A power supply terminal 81 is a terminal to which a fixed voltage $V_{cap}$ is applied.

A resistor 82 has one end connected to the power supply terminal 81.

An FET 83 has a drain terminal connected to the other end of the resistor 82 and has a gate terminal connected to the other end of a drive signal output circuit 15.

The fifth embodiment illustrates an example in which the impedance adjusting circuit 80 includes the FET 83, but the present invention is not limited to this case, and for example, the impedance adjusting circuit 80 may include a BJT.

When the impedance adjusting circuit 80 includes a BJT, the collector terminal of the BJT is connected to the other end of the resistor 82, and a base terminal is connected to the other end of the drive signal output circuit 15.

A resistor 84 has one end connected to the source terminal of the FET 83.

A resistor 85 has one end connected to the other end of the resistor 84, and has the other end connected to the ground.

A resistor 86 is a first resistor having one end connected to the drain terminal of the E-type FET 11.

A capacitor 87 is a first capacitor having one end connected to the other end of the resistor 86.

The capacitor 88 is a second capacitor having one end connected to the drain terminal of the D-type FET 12.

The varactor diode 89 has an anode terminal connected to the other end of the capacitor 87, has a cathode terminal connected to the other end of the capacitor 88, and decreases a capacitance when a drive signal is output from the drive signal output circuit 15.

A resistor 90 is connected between an anode terminal of the varactor diode 89 and the ground.

A resistor 91 has one end connected between the resistor 84 and the resistor 85, and has the other end connected to a cathode terminal of the varactor diode 89.

Next, operation will be described.

In the FET 83 of the impedance adjusting circuit 80, when a drive signal is output from the diode 32 of the drive signal output circuit 15, a potential of a gate terminal rises, and a current flowing between a drain terminal and a source terminal increases.

By the increase in current flowing between the drain terminal and the source terminal of the FET 83, a potential between the resistor 84 and the resistor 85 rises, and a potential difference between both ends of the varactor diode 89 increases.

The varactor diode 89 has a relationship between a potential difference between both ends and capacitance as illustrated in FIG. 11, and therefore decreases the capacitance when the potential difference between both ends increases.

When the capacitance of the varactor diode 89 decreases, an impedance of a feedback path of the D-type FET 12 including the capacitors 87 and 88, the resistors 86, 90, and 91, and the varactor diode 89 rises. A load impedance rises when viewed from the D-type FET 12.

Figure 20:
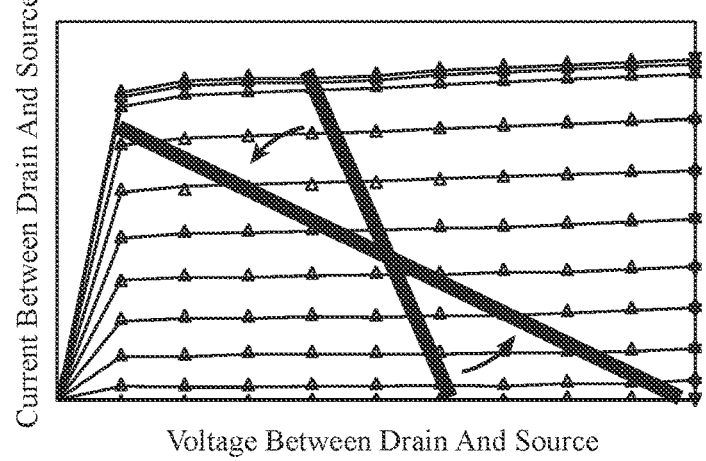
FIG. 20 is an explanatory graph illustrating IV characteristics of the D-type FET 12.

Here, FIG. 20 is an explanatory graph illustrating IV characteristics of the D-type FET 12.

FIG. 20 illustrates, as IV characteristics of the D-type FET 12, a correspondence between a voltage between the drain terminal and the source terminal in the D-type FET 12 and a current flowing between the drain terminal and the source terminal in the D-type FET 12.

That is, FIG. 20 indicates that a rise in load impedance increases a voltage between the drain terminal and the source terminal in the D-type FET 12 and decreases a current flowing between the drain terminal and the source terminal in the D-type FET 12.

As illustrated in FIG. 20, a rise in load impedance decreases a current flowing between the drain terminal and the source terminal in the D-type FET 12.

An increase in voltage between the drain terminal and the source terminal in the D-type FET 12 decreases the potential difference $V_1$ between the source terminal of the E-type FET 11 and the source terminal of the D-type FET 12.

Therefore, by determining the threshold voltage $V_{th}$ to an appropriate value by the resistors 31 and 34 and the diode 32, it is possible to decrease a maximum value of the potential difference $V_1$ which is a voltage applied to the E-type FET 11.

As a result, according to the fifth embodiment, as in the first to fourth embodiments, even when a signal to be amplified is an RF signal, destruction of the E-type FET 11 can be prevented.

Sixth Embodiment

The fifth embodiment illustrates an example in which the high frequency amplifier includes the impedance adjusting circuit 80 for adjusting an impedance between the drain terminal of the E-type FET 11 and the drain terminal of the D-type FET 12.

A sixth embodiment illustrates an example in which a high frequency amplifier includes an impedance adjusting circuit 100 for adjusting an impedance between the drain terminal of an E-type FET 11 and the gate terminal of the E-type FET 11.

Figure 21:
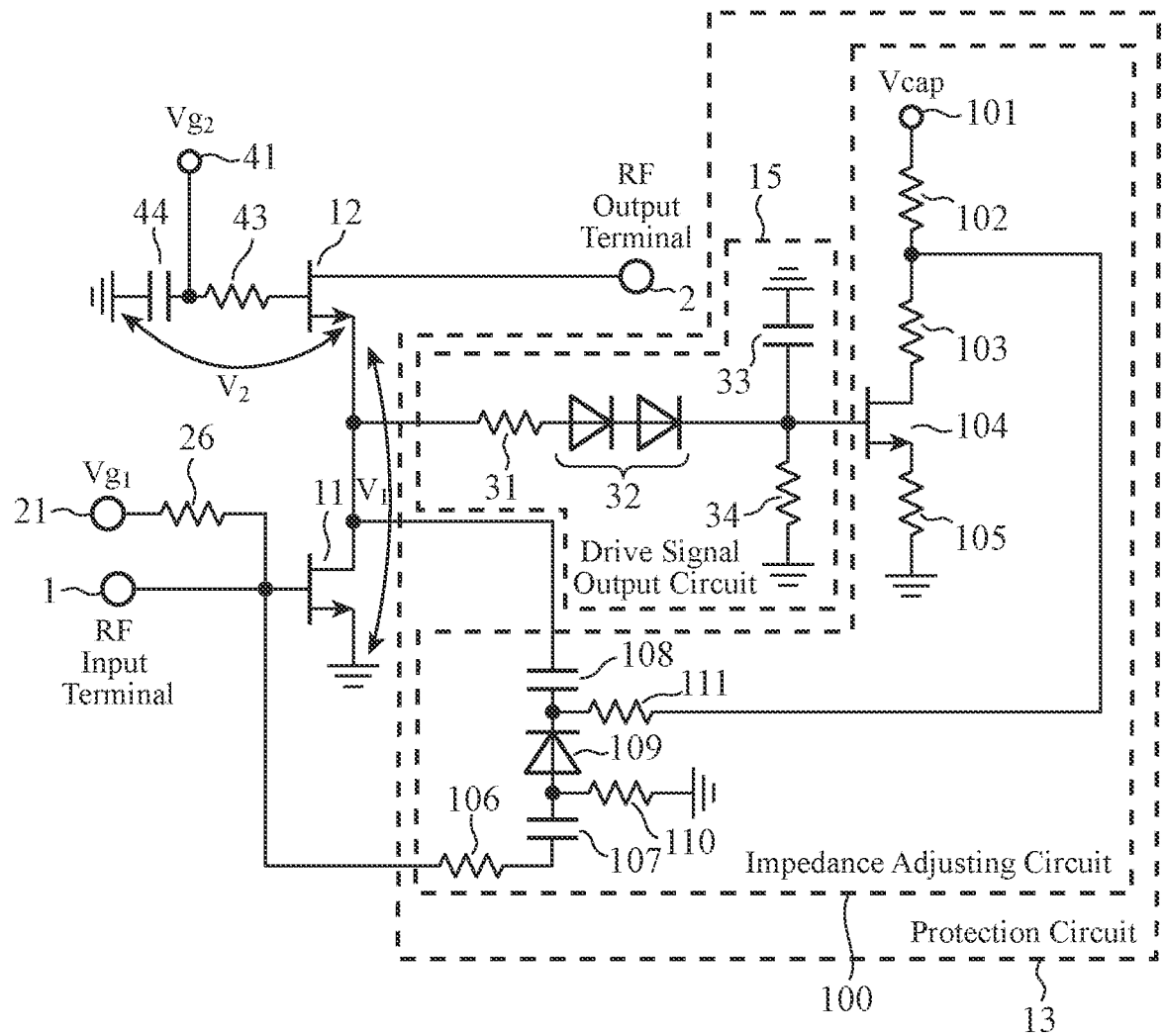
FIG. 21 is a configuration diagram illustrating a high frequency amplifier according to a sixth embodiment of the present invention.

FIG. 21 is a configuration diagram illustrating a high frequency amplifier according to the sixth embodiment of the present invention. In FIG. 21, the same reference numerals as in FIG. 1 indicate the same or corresponding parts, and therefore description thereof is omitted.

The sixth embodiment illustrates an example in which a first transistor is an E-type FET 11 as in the first embodiment, but the present invention is not limited to this case, and for example, the first transistor may be a BJT.

The sixth embodiment illustrates an example in which a second transistor is a D-type FET 12 as in the first embodiment, but the present invention is not limited to this case, and for example, the second transistor may be a BJT.

The impedance adjusting circuit 100 is a circuit for reducing an impedance between the drain terminal of the E-type FET 11 and the gate terminal of the E-type FET 11 when a potential difference $V_1$ between the source terminal of the E-type FET 11 and the source terminal of the D-type FET 12 is larger than a threshold voltage $V_{th}$.

A power supply terminal 101 is a terminal to which a fixed voltage $V_{cap}$ is applied.

A resistor 102 has one end connected to the power supply terminal 101.

A resistor 103 has one end connected to the other end of the resistor 102.

An FET 104 has a drain terminal connected to the other end of the resistor 103 and has a gate terminal connected to the other end of a drive signal output circuit 15.

The sixth embodiment illustrates an example in which the impedance adjusting circuit 100 includes the FET 104, but the present invention is not limited to this case, and for example, the impedance adjusting circuit 100 may include a BJT.

When the impedance adjusting circuit 100 includes a BJT, the collector terminal of the BJT is connected to the other end of the resistor 103, and a base terminal is connected to the other end of the drive signal output circuit 15.

A resistor 105 has one end connected to the source terminal of the FET 104, and has the other end connected to the ground.

A resistor 106 is a first resistor connected to the gate terminal of the E-type FET 11.

A capacitor 107 is a first capacitor having one end connected to the other end of the resistor 106.

A capacitor 108 is a second capacitor having one end connected to the drain terminal of the E-type FET 11.

A varactor diode 109 has an anode terminal connected to the other end of the capacitor 107, has a cathode terminal connected to the other end of the capacitor 108, and increases a capacitance when a drive signal is output from the drive signal output circuit 15.

A resistor 110 is connected between an anode terminal of the varactor diode 109 and the ground.

A resistor 111 has one end connected between the resistor 102 and the resistor 103, and has the other end connected to a cathode terminal of the varactor diode 109.

Next, operation will be described.

In the FET 104 of the impedance adjusting circuit 100, when a drive signal is output from the diode 32 of the drive signal output circuit 15, a potential of a gate terminal rises, and a current flowing between a drain terminal and a source terminal increases.

By the increase in current flowing between the drain terminal and the source terminal of the FET 104, voltage drop in the resistor 102 increases, and a potential difference between both ends of the varactor diode 109 decreases.

The varactor diode 109 has a relationship between a potential difference between both ends and capacitance as illustrated in FIG. 11, and therefore increases a capacitance when the potential difference between both ends decreases.

An increase in capacitance of the varactor diode 89 decreases an impedance of a feedback path of the E-type FET 11 including the capacitors 107 and 108, the resistors 106, 110, and 111, and the varactor diode 109. A load impedance decreases when viewed from the E-type FET 11.

Figure 22:
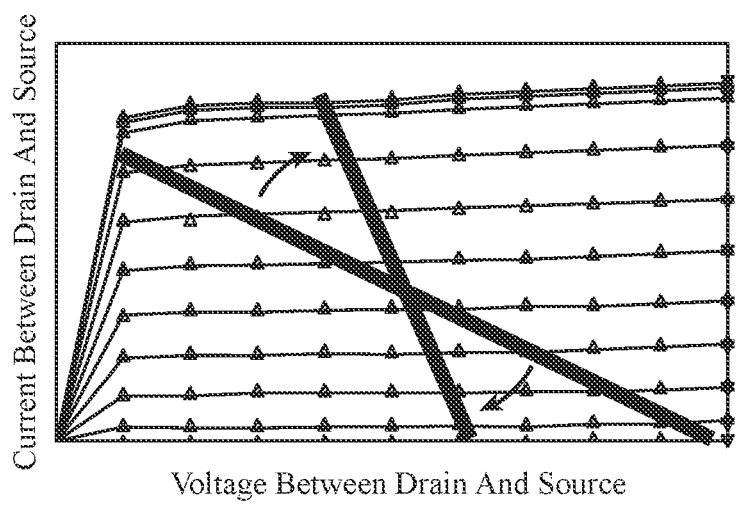
FIG. 22 is an explanatory graph illustrating IV characteristics of the E-type FET 11.

Here, FIG. 22 is an explanatory graph illustrating IV characteristics of the E-type FET 11.

FIG. 22 illustrates, as IV characteristics of the E-type FET 11, a correspondence between a voltage between the drain terminal and the source terminal in the E-type FET 11 and a current flowing between the drain terminal and the source terminal in the E-type FET 11.

That is, FIG. 22 indicates that a decrease in load impedance decreases a voltage between the drain terminal and the source terminal in the E-type FET 11 and increases a current flowing between the drain terminal and the source terminal in the E-type FET 11.

As illustrated in FIG. 22, a decrease in load impedance decreases a voltage between the drain terminal and the source terminal in the E-type FET 11.

When the voltage between the drain terminal and the source terminal in the E-type FET 11 decreases, the potential difference $V_1$ between the source terminal of the E-type FET 11 and the source terminal of the D-type FET 12 decreases.

Therefore, by determining the threshold voltage $V_{th}$ to an appropriate value by the resistors 31 and 34 and the diode 32, it is possible to decrease a maximum value of the potential difference $V_1$ which is a voltage applied to the E-type FET 11.

As a result, according to the sixth embodiment, as in the first to fifth embodiments, even when a signal to be amplified is an RF signal, destruction of the E-type FET 11 can be prevented.

Seventh Embodiment

The first to sixth embodiments illustrate an example in which the high frequency amplifier includes the E-type FET 11.

A seventh embodiment illustrates an example in which a high frequency amplifier includes a gallium nitride high electron mobility transistor with a recess gate structure.

Figure 23:
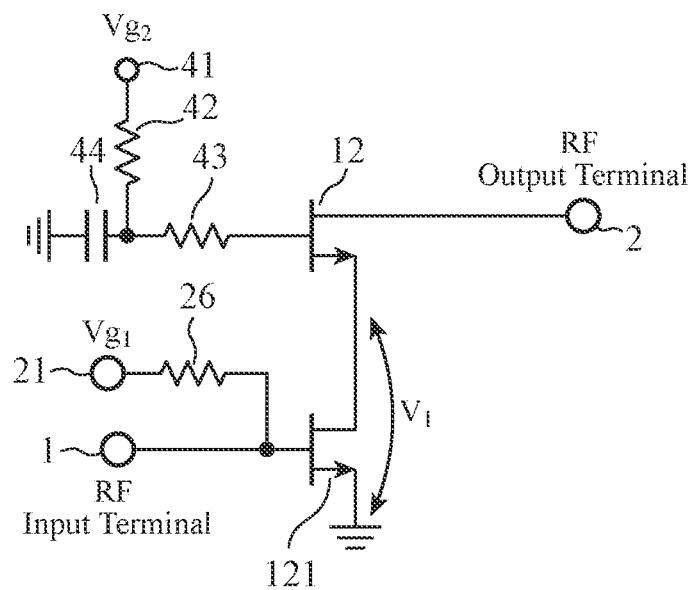
FIG. 23 is a configuration diagram illustrating a high frequency amplifier according to a seventh embodiment of the present invention.

FIG. 23 is a configuration diagram illustrating a high frequency amplifier according to the seventh embodiment of the present invention. In FIG. 23, the same reference numerals as in FIG. 1 indicate the same or corresponding parts, and therefore description thereof is omitted.

A GaNHEMT 121 is a gallium nitride high electron mobility transistor with a recess gate structure.

The GaNHEMT 121 has a gate terminal connected to an RF input terminal 1 and has a source terminal grounded.

Next, operation will be described.

In the example of FIG. 23, a potential difference between the source terminal of the GaNHEMT 121 and the source terminal of a D-type FET 12 is $V_1$.

In a high frequency amplifier having a cascode structure, an input capacitance of a transistor connected to the RF input terminal 1 is a parameter for determining an increase in operating frequency.

Therefore, in the seventh embodiment, the GaNHEMT 121 capable of high speed operation is used as a transistor connected to the RF input terminal 1.

By using the GaNHEMT 121 as a transistor connected to the RF input terminal 1, control with a positive voltage is possible, and high frequency operation is possible.

In addition, since the GaNHEMT 121 has a wider band gap than, for example, an E-type FET, a possibility of failure of a transistor connected to the RF input terminal 1 can be reduced.

In the seventh embodiment, the GaNHEMT 121 and the D-type FET 12 are disposed on the same chip.

Figure 24:
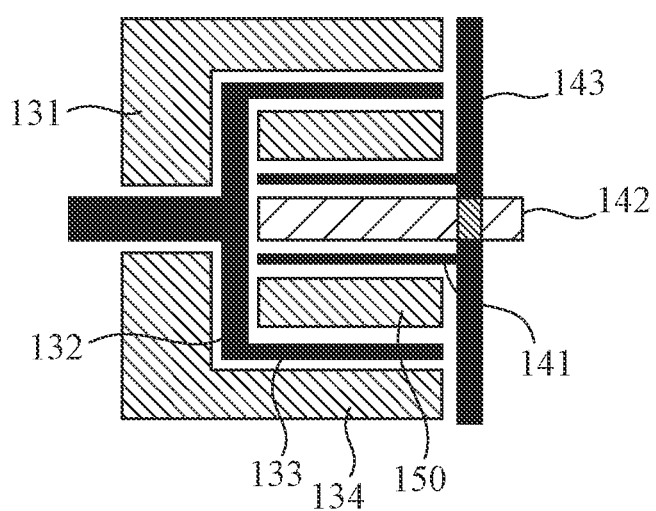
FIG. 24 is a configuration diagram illustrating a GaN-HEMT 121 and the D-type FET 12 disposed on the same chip.

FIG. 24 is a configuration diagram illustrating the GaNHEMT 121 and the D-type FET 12 disposed on the same chip.

In FIG. 24, reference numeral 131 represents a source pad of the GaNHEMT 121, reference numeral 132 represents a gate pad of the GaNHEMT 121, reference numeral 133 represents a gate finger of the GaNHEMT 121, and reference numeral 134 represents a source finger of the GaNHEMT 121.

Reference numeral 141 represents a gate finger of the D-type FET 12, reference numeral 142 represents a drain finger of the D-type FET 12, and reference numeral 143 represents a gate pad of the D-type FET 12.

Reference numeral 150 represents a finger serving as both the drain finger of the GaNHEMT 121 and the source finger of the D-type FET 12.

In the example of FIG. 24, the drain finger of the GaNHEMT 121 and the source finger of the D-type FET 12 share the same finger 150. Therefore, the high frequency amplifier can be miniaturized.

The seventh embodiment illustrates an example in which the high frequency amplifier includes the D-type FET 12, but a normal GaNHEMT or silicon carbide field effect transistor (SiCFET) may be used instead of the D-type FET 12. The normal GaNHEMT means a GaNHEMT that is not a GaNHEMT with a recess gate structure.

Even when the normal GaNHEMT or SiCFET is used instead of the D-type FET 12, as illustrated in FIG. 24, the normal GaNHEMT or SiCFET and the GaNHEMT 121 can be disposed on the same chip.

Note that the present invention can freely combine the embodiments to each other, modify any constituent element in each of the embodiments, or omit any constituent element in each of the embodiments within the scope of the invention.

INDUSTRIAL APPLICABILITY

The present invention is suitable for a high frequency amplifier including a first transistor and a second transistor.

REFERENCE SIGNS LIST

1: RF input terminal, 2: RF output terminal, 11: E-type FET (first transistor), 12: D-type FET (second transistor), 13: Protection circuit, 14: Power supply circuit, 15: Drive signal output circuit, 21: Power supply terminal, 22: Resistor (first resistor), 23: FET (third transistor), 24: Resistor (second resistor), 25: Resistor (third resistor), 26: Resistor, 31: Resistor, 32: Diode, 33: Capacitor, 34: Resistor, 35: Voltage input terminal, 36: Comparator, 41: Power supply terminal, 42: Resistor (first resistor), 43: Resistor (fourth resistor), 44: Capacitor, 50: Power supply circuit, 51: Resistor (second resistor), 52: FET (third transistor), 53: Resistor (third resistor), 60: Power supply circuit, 61: Power supply terminal, 62: Resistor (first resistor), 63: FET (third transistor), 64: Resistor (second resistor), 65: Resistor (third resistor), 66: Resistor (fourth resistor), 67: Resistor (fifth resistor), 68: Capacitor, 69: Varactor diode, 70: Power supply circuit, 71: Resistor (second resistor), 72: FET (fourth transistor), 80: Impedance adjusting circuit, 81: Power supply terminal, 82: Resistor, 83: FET, 84: Resistor, 85: Resistor, 86: Resistor, 87: Capacitor (first capacitor), 88: Capacitor (second capacitor), 89: Varactor diode, 90: Resistor, 91: Resistor, 100: Impedance adjusting circuit, 101: Power supply terminal, 102: Resistor, 103: Resistor, 104: FET, 105: Resistor, 106: Resistor (first resistor), 107: Capacitor (first capacitor), 108: Capacitor (second capacitor), 109: Varactor diode, 110: Resistor, 111: Resistor, 121: GaNHEMT (gallium nitride high electron mobility transistor), 131: Source pad of GaN-HEMT, 132: Gate pad of GaNHEMT, 133: Gate finger of GaNHEMT, 134: Source finger of GaNHEMT, 141: Gate finger of D-type FET, 142: Drain finger of D-type FET, 143: Gate pad of D-type FET, 150: Finger serving as both drain finger of GaNHEMT and source finger of D-type FET

The invention claimed is:

1. A high frequency amplifier comprising:
a first transistor having a gate terminal or a base terminal, a high frequency signal to be amplified being supplied to the gate terminal or the base terminal of the first transistor, the first transistor having a source terminal or an emitter terminal, either of which is grounded;
a second transistor having a source terminal or an emitter terminal, either of which is connected to a drain terminal or a collector terminal of the first transistor, the second transistor having a drain terminal or a collector terminal, an amplified high frequency signal being output from the drain terminal or the collector terminal of the second transistor; and
a protection circuit to start an operation to reduce a potential difference between the source terminal or the emitter terminal of the first transistor and the source terminal or the emitter terminal of the second transistor to make the potential difference smaller than a threshold voltage when the potential difference is larger than the threshold voltage, wherein the protection circuit includes a drive signal output circuit that determines the threshold voltage used in the operation.

2. The high frequency amplifier according to claim 1, wherein
the protection circuit includes a power supply circuit to apply a voltage to the gate terminal or the base terminal of the first transistor, and
the power supply circuit increases the voltage to be applied to the gate terminal or the base terminal of the first transistor when the potential difference between the source terminal or the emitter terminal of the first transistor and the source terminal or the emitter terminal of the second transistor is larger than the threshold voltage.

3. The high frequency amplifier according to claim 2, wherein
a drive signal output circuit comprises one end connected to the drain terminal or the collector terminal of the first transistor, the drive signal output circuit outputting a drive signal from the other end thereof when the potential difference is larger than the threshold voltage, and
the power supply circuit includes:
a power supply terminal to which a voltage is applied;
a first resistor in which one end thereof is connected to the power supply terminal;
a third transistor having a drain terminal or a collector terminal, either of which is connected to the other end of the first resistor, the third transistor having a gate terminal or a base terminal, either of which is connected to the other end of the drive signal output circuit;
a second resistor in which one end thereof is connected to the source terminal or the emitter terminal of the third transistor; and
a third resistor in which one end thereof is connected to the other end of the second resistor and the gate terminal or the base terminal of the first transistor, and the other end thereof is connected to a ground.

4. The high frequency amplifier according to claim 3, wherein the drive signal output circuit includes a diode, a comparator, or an operational amplifier as a component to output a drive signal when the potential difference is larger than the threshold voltage.

5. The high frequency amplifier according to claim 1, wherein
the protection circuit includes a power supply circuit to apply a voltage to a gate terminal or a base terminal of the second transistor, and
the power supply circuit decreases a voltage to be applied to the gate terminal or the base terminal of the second transistor when the potential difference between the source terminal or the emitter terminal of the first transistor and the source terminal or the emitter terminal of the second transistor is larger than the threshold voltage.

6. The high frequency amplifier according to claim 5, wherein
a drive signal output circuit comprises one end connected to the drain terminal or the collector terminal of the first transistor, the drive signal output circuit outputting a drive signal from the other end thereof when the potential difference is larger than the threshold voltage, and
the power supply circuit includes:
a power supply terminal to which a voltage is applied;
a first resistor in which one end thereof is connected to the power supply terminal;
a second resistor in which one end thereof is connected to the other end of the first resistor;
a third transistor having a drain terminal or a collector terminal, either of which is connected to the other end of the second resistor, and the third transistor having a gate terminal or a base terminal, either of which is connected to the other end of the drive signal output circuit;
a third resistor in which one end thereof is connected to a source terminal or an emitter terminal of the third transistor, and the other end thereof is connected to a ground;
a fourth resistor in which one end thereof is connected to the other end of the first resistor, and the other end thereof is connected to the gate terminal or the base terminal of the second transistor; and
a capacitor in which one end thereof is connected to the other end of the first resistor, and the other end thereof is connected to the ground.

7. The high frequency amplifier according to claim 6, wherein the drive signal output circuit includes a diode, a comparator, or an operational amplifier as a component to output a drive signal when the potential difference is larger than the threshold voltage.

8. The high frequency amplifier according to claim 5, wherein
a drive signal output circuit comprises one end connected to the drain terminal or the collector terminal of the first transistor, the drive signal output circuit outputting a drive signal from the other end thereof when the potential difference is larger than the threshold voltage, and
the power supply circuit includes:
a power supply terminal to which a voltage is applied;
a first resistor in which one end thereof is connected to the power supply terminal;

a third transistor having a drain terminal or a collector terminal, either of which is connected to the other end of the first resistor, the third transistor having a gate terminal or a base terminal, either of which is connected to the other end of the drive signal output circuit;

a second resistor in which one end thereof is connected to a source terminal or an emitter terminal of the third transistor;

a third resistor in which one end thereof is connected to the other end of the second resistor, and the other end thereof is connected to a ground;

a fourth resistor in which one end thereof is connected to the power supply terminal;

a fifth resistor in which one end thereof is connected to the other end of the fourth resistor, and the other end thereof connected to the gate terminal or the base terminal of the second transistor;

a capacitor in which one end thereof is connected to the other end of the fourth resistor and the other end thereof is connected between the other end of the second resistor and one end of the third resistor; and a varactor diode in which one end thereof is connected to the other end of the capacitor, and the other end thereof is connected to the ground.

9. The high frequency amplifier according to claim 8, wherein the drive signal output circuit includes a diode, a comparator, or an operational amplifier as a component for outputting a drive signal when the potential difference is larger than the threshold voltage.

10. The high frequency amplifier according to claim 5, wherein
a drive signal output circuit comprises one end connected to the drain terminal or the collector terminal of the first transistor, the drive signal output circuit outputting a drive signal from the other end thereof when the potential difference is larger than the threshold voltage, and
the power supply circuit includes:
a power supply terminal to which a voltage is applied;
a first resistor in which one end thereof is connected to the power supply terminal;
a second resistor in which one end thereof is connected to the other end of the first resistor;
a third transistor having a drain terminal or a collector terminal, either of which is connected to the other end of the second resistor, the third transistor having a gate terminal and a base terminal, either of which is connected to the other end of the drive signal output circuit;
a third resistor in which one end thereof is connected to a source terminal or an emitter terminal of the third transistor, and the other end thereof is connected to a ground;
a fourth resistor in which one end thereof is connected to the power supply terminal, and the other end thereof is connected to the gate terminal or the base terminal of the second transistor;
a capacitor in which one end thereof is connected to the other end of the fourth resistor; and
a fourth transistor having a drain terminal or a collector terminal, either of which is connected to the other end of the capacitor, the fourth transistor having a source terminal or an emitter terminal, either of which is connected to the ground, the fourth transistor having a gate terminal or a base terminal, either of which is connected to the other end of the first resistor.

11. The high frequency amplifier according to claim 10, wherein the drive signal output circuit includes a diode, a comparator, or an operational amplifier as a component to output a drive signal when the potential difference is larger than the threshold voltage.

12. The high frequency amplifier according to claim 1, wherein
the protection circuit includes an impedance adjusting circuit to adjust an impedance between the drain terminal or the collector terminal of the first transistor and the drain terminal or the collector terminal of the second transistor, and
the impedance adjusting circuit increases an impedance between the drain terminal or the collector terminal of the first transistor and the drain terminal or the collector terminal of the second transistor when the potential difference between the source terminal or the emitter terminal of the first transistor and the source terminal or the emitter terminal of the second transistor is larger than the threshold voltage.

13. The high frequency amplifier according to claim 12, wherein
a drive signal output circuit comprises one end connected to the drain terminal or the collector terminal of the first transistor, the drive signal output circuit outputting a drive signal from the other end thereof when the potential difference is larger than the threshold voltage, and
the impedance adjusting circuit includes:
a first resistor in which one end thereof is connected to the drain terminal or the collector terminal of the first transistor;
a first capacitor in which one end thereof is connected to the other end of the first resistor;
a second capacitor in which one end thereof is connected to the drain terminal or the collector terminal of the second transistor; and
a varactor diode connected between the other end of the first capacitor and the other end of the second capacitor, the varactor diode decreasing a capacitance when a drive signal is output from the drive signal output circuit.

14. The high frequency amplifier according to claim 1, wherein
the protection circuit includes an impedance adjusting circuit to adjust an impedance between the drain terminal or the collector terminal of the first transistor and the gate terminal or the base terminal of the first transistor, and
the impedance adjusting circuit reduces an impedance between the drain terminal or the collector terminal of the first transistor and the gate terminal or the base terminal of the first transistor when the potential difference between the source terminal or the emitter terminal of the first transistor and the source terminal or the emitter terminal of the second transistor is larger than the threshold voltage.

15. The high frequency amplifier according to claim 14, wherein
a drive signal output circuit comprises one end connected to the drain terminal or the collector terminal of the first transistor, and a drive signal is output from the other end thereof when the potential difference is larger than the threshold voltage, and
the impedance adjusting circuit includes:
a first resistor in which one end thereof is connected to the gate terminal or the base terminal of the first transistor;
a first capacitor in which one end thereof is connected to the other end of the first resistor;

a second capacitor in which one end thereof is connected to the drain terminal or the collector terminal of the first transistor; and a varactor diode connected between the other end of the first capacitor and the other end of the second capacitor, the varactor diode increasing a capacitance when a drive signal is output from the drive signal output circuit.

16. The high frequency amplifier according to claim 1, wherein the first transistor is an enhancement type field effect transistor or a bipolar transistor operating at a high frequency, and the second transistor is a depletion type field effect transistor or a bipolar transistor operating at a high frequency.

* * * * *